(12) United States Patent
Ghoshal

(10) Patent No.: US 11,903,317 B2
(45) Date of Patent: *Feb. 13, 2024

(54) THERMOELECTRIC DEVICE STRUCTURES

(71) Applicant: Sheetak, Inc., Austin, TX (US)

(72) Inventor: Uttam Ghoshal, Austin, TX (US)

(73) Assignee: Sheetak, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/949,209

(22) Filed: Sep. 20, 2022

(65) Prior Publication Data
US 2023/0012332 A1   Jan. 12, 2023

Related U.S. Application Data

(63) Continuation of application No. 16/492,889, filed as application No. PCT/US2018/002314 on Mar. 19, 2018, now Pat. No. 11,462,669.

(60) Provisional application No. 62/473,051, filed on Mar. 17, 2017.

(51) Int. Cl.
*H10N 10/817* (2023.01)
*H10N 10/852* (2023.01)
*H10N 10/853* (2023.01)
*H10N 10/854* (2023.01)
*H10N 10/855* (2023.01)
*H10N 19/00* (2023.01)

(52) U.S. Cl.
CPC ......... *H10N 10/817* (2023.02); *H10N 10/852* (2023.02); *H10N 10/853* (2023.02); *H10N 10/854* (2023.02); *H10N 10/855* (2023.02); *H10N 19/101* (2023.02)

(58) Field of Classification Search
CPC .................................................... H10N 19/101
See application file for complete search history.

(56) References Cited

U.S. PATENT DOCUMENTS

| | | | | |
|---|---|---|---|---|
| 4,971,632 A * | 11/1990 | Rowe | ................... | H10N 10/853 136/212 |
| 6,492,585 B1 * | 12/2002 | Zamboni | .............. | H10N 19/101 438/54 |
| 2002/0062853 A1 * | 5/2002 | Kajihara | ................. | H10N 10/01 136/201 |
| 2011/0000224 A1 * | 1/2011 | Ghoshal | ............... | H10N 10/817 438/54 |
| 2013/0153819 A1 * | 6/2013 | Tseng | .................... | H10N 10/852 977/734 |
| 2014/0070190 A1 * | 3/2014 | Chen | ...................... | H10K 59/00 257/40 |

(Continued)

*Primary Examiner* — Eli S Mekhlin
(74) *Attorney, Agent, or Firm* — Clark Hill PLC

(57) ABSTRACT

The present disclosure is related to structures for and methods for producing thermoelectric devices. The thermoelectric devices include multiple stages of thermoelements. Each stage includes alternating n-type and p-type thermoelements. The stages are sandwiched between upper and lower sets of metal links fabricated on a pair of substrate layers. The metal links electrically connect pairs of n-type and p-type thermoelements from each stage. There may be additional sets of metal links between the multiple stages. The individual thermoelements may be sized to handle differing amounts of electric current to optimize performance based on their location within the multistage device.

19 Claims, 16 Drawing Sheets

(56) References Cited

U.S. PATENT DOCUMENTS

2014/0137918 A1* 5/2014 Zirkle ................. H10N 10/817
                                                    136/224

* cited by examiner

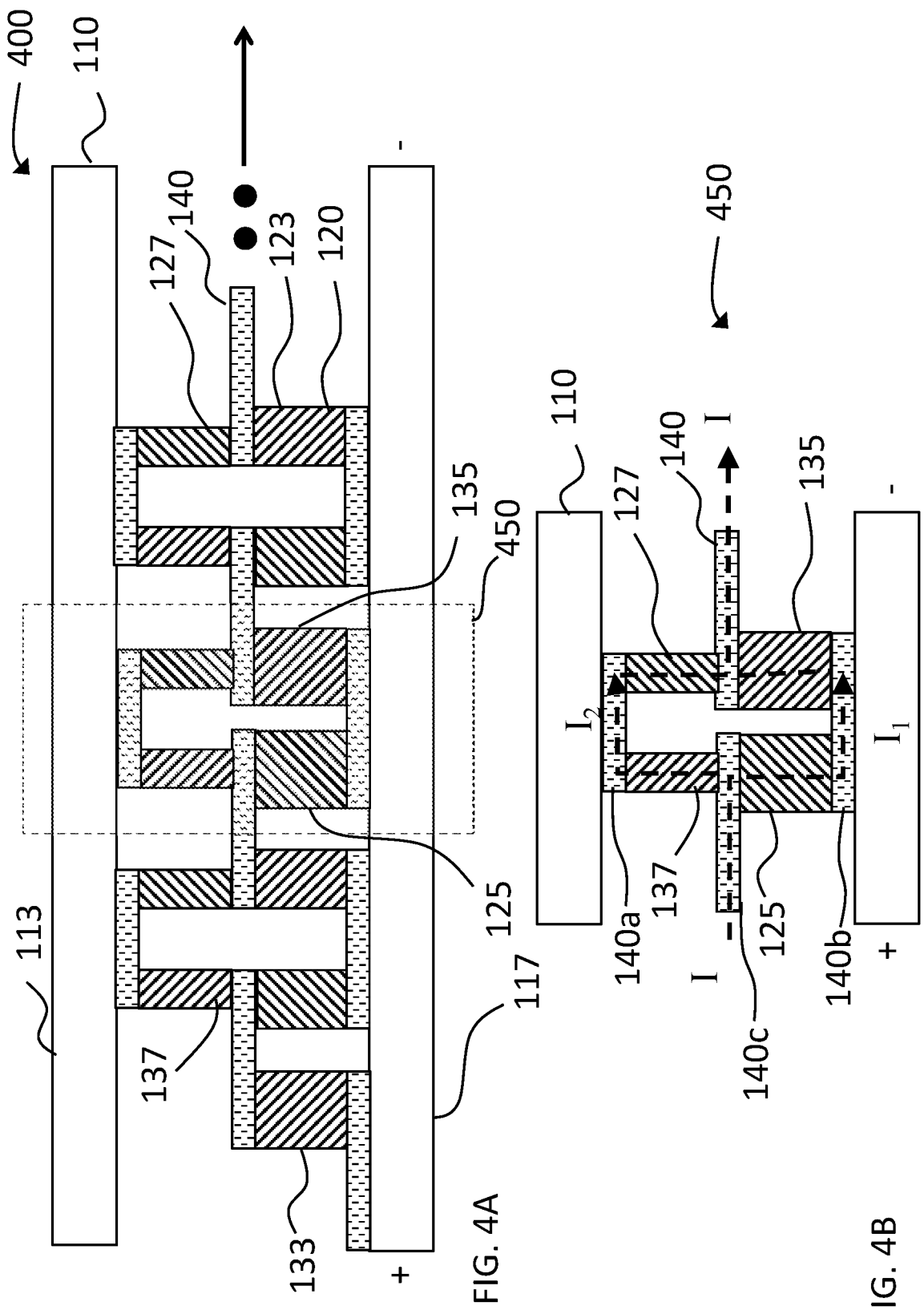

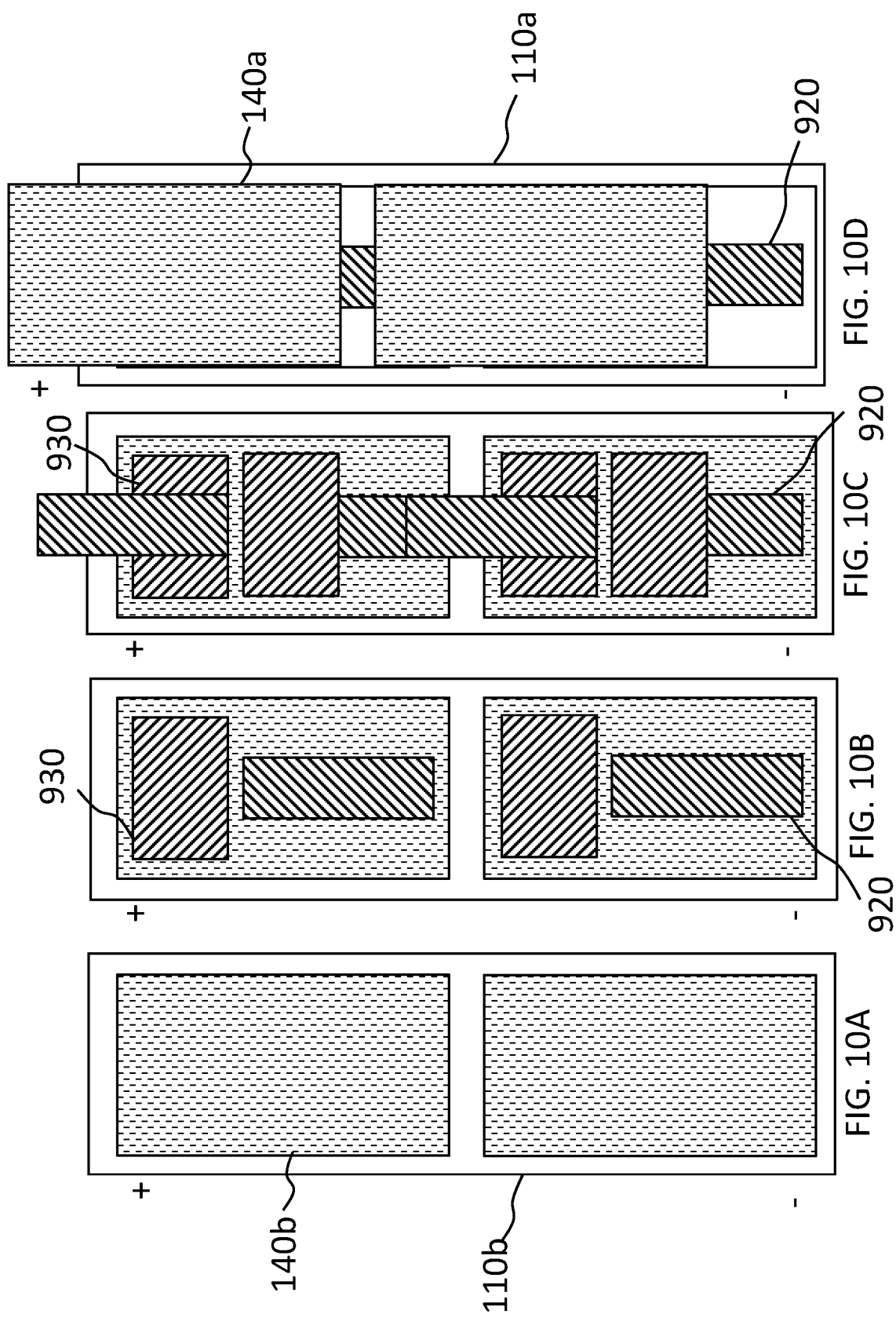

THERMOELECTRIC DEVICE STRUCTURES

BACKGROUND OF THE DISCLOSURE

1. Field of the Disclosure

The present disclosure relates to apparatuses and methods for using thermoelectric devices, and, in particular, increasing coefficients of performance in thermoelectric devices and efficiencies for heating, cooling, and power generation.

2. Description of the Related Art

Thermoelectric devices have been used since the 1900s to heat, cool, and generate power; however, widespread use has been held back due to poor performance and low efficiency when compared with other available heating, cooling, and power generation technologies. Key factors in understanding the performance of thermoelectric devices include the coefficient of performance (COP), which is the ratio of the thermal output power and the electrical input power of a thermoelectric device, the temperature differential across the hot and cold sides of the thermoelectric device, and the efficiency and reliability of the thermoelectric device.

A shortcoming in prior art thermoelectric devices is backflow of heat and Joule heating which result in low COP and efficiency. Another shortcoming is low reliability due to heat-related expansion and contraction of the thermoelements and adjacent structures, which can result in failures. Another shortcoming in prior art thermoelectric devices is the presence of temperature drops in layers between thermoelements that reduce the efficiency of the thermoelements.

What are needed are thermoelectric device structures that reduce thermal losses, resist heat expansion/contraction-related failures, and reduce temperature drops across non-thermoelement structures.

BRIEF SUMMARY OF THE DISCLOSURE

In aspects, the present disclosure is related to an apparatus and method for using thermoelectric devices, and, in particular, increasing coefficients of performance in thermoelectric devices and efficiencies for heating, cooling, and power generation.

One embodiment according to the present disclosure includes a thermoelectric apparatus, the apparatus including: a first substrate layer; a first set of metal links disposed on one side of the first substrate layer; a first stage of thermoelements disposed on and in electrical and thermal communication with the first set of metal links and including: a first plurality of n-type thermoelements; and a first plurality of p-type thermoelements alternating with the first plurality of n-type thermoelements; a second stage of thermoelements disposed on and in electrical and thermal communication with the first stage of thermoelements and including: a second plurality of n-type thermoelements; and a second plurality of p-type thermoelements alternating with the second plurality of n-type thermoelements; a second set of metal links disposed on and in electrical and thermal communication with the second stage of thermoelements; and a second substrate layer disposed on the second set of metal links. The apparatus may also have a front end and a back end and the first stage thermoelement closest to the front end may be the same type as the second stage thermoelement closest to the front end. The first stage thermoelement closest to the back end may also be the same type as the second stage thermoelement closest to the back end. The thermoelements of the second stage may have greater electrical resistances than the thermoelements of the first stage. The n-type thermoelements may include a thermoelectric material of at least one of: alloys of bismuth telluride and bismuth selenide, $Bi_2Te_{2.7}Se_{0.3}$, P-doped SiGe, $YbAl_3$, P-doped Si, SiGe nanowires, rare earth tellurides, $La_3Te_4$, $Pr_3Te_4$, skutterudites, Ba—Yb—$CoSb_3$, chacogenides, Pb—Sb—Ag—Te, Pb—Te—Se, Mg—Ag—Sb, half-Heusler alloys, and Hf—Zr—Ni—Sn—Sb. The p-type thermoelements may include a p-type thermoelectric material of at least one of: alloys of bismuth telluride and antimony telluride, $Bi_{0.5}Sb_{1.5}Te_3$, B-doped SiGe, B-doped Si, SiGe nanowires, $Zn_4Sb_3$, skutterudites, $CeFe_{3.5}Co_{0.5}Sb_{12}$, Zintl compounds, $Yb_{14}MnSb_{11}$, rare earth tellurides, $Ce_3Te_4$, $MnSi_{1.73}$, SnSe, PbSbAgSnTe, $CePd_3$, $NaCo_2O_4$, half-Heusler alloys, and Nb—Ti—Fe—Sb—Sn. The n-type thermoelements may include $Bi_{2-x}Sb_xTe_3$ and the p-type thermoelements may include $Bi_2Te_{3-y}Se_y$, where x is between about 1.4 and 1.6 and y is between about 0.1 and 0.3. The apparatus may include a third set of metal links disposed between the first stage of thermoelements and the second stage of thermoelements. The substrate layer may be made of one of: a ceramic, an insulator and metal combination, and an insulator and semiconductor combination, wherein 1) the ceramic comprises at least one of: alumina $Al_2O_3$, aluminum nitride (AlN), berylium oxide (BeO), boron nitride (BN), diamond (C), silicon nitride (SiN), and sapphire (SiC); 2) in the insulator and metal combination, the insulator comprises at least one of: polymide, parylene, anodized aluminum, anodized molybdenum, CVD alumina, plated ceramics, and parylene or polymide-coated anodized alumina; and the metal comprises at least one of: aluminum, copper, nickel, molybdenum, molybdenum-copper alloy, tungsten-copper alloy, and copper-aluminum composite; and 3) in the insulator and semiconductor combination, the insulator comprises at least one of: thermal silicon oxide, CVD silicon oxide, and silicon nitride (SiN); and the semiconductor comprises one of: silicon and silicon carbide (SiC). The insulator may be equal to or less than about 10 micrometers thick. The metal links may be made of at least one of: 1) copper, 2) copper with a coating of nickel, gold, platinum/gold alloy, or silver, 3) nickel with a coating of gold, platinum/gold alloy, or silver. The structure of the n-type and p-type thermoelements may include a pair of metal layers; a pair of coating layers disposed between the metal layers; and one of an n-type and p-type thermoelectric material disposed between the pair of coating layers, and the coating layers may include at least one of: titanium tungsten (TiW), tantalum nitride (TaN), tantalum (Ta), and nickel (Ni).

Another embodiment according to the present disclosure includes a thermoelectric apparatus, the apparatus including: a first substrate layer; a first set of metal links disposed on one side of the first substrate layer; a first stage of thermoelements disposed on and in electrical and thermal communication with the first set of metal links and including: a first plurality of n-type thermoelements; and a first plurality of p-type thermoelements alternating with the first plurality of n-type thermoelements; a second stage of thermoelements disposed on and in electrical and thermal communication with the first stage of thermoelements and including: a second plurality of n-type thermoelements; and a second plurality of p-type thermoelements alternating with the second plurality of n-type thermoelements; a third stage of thermoelements disposed on and in electrical and thermal communication with the second stage of thermoelements and including: a third plurality of n-type thermoelements; and a third plurality of p-type thermoelements alternating with the third plurality of n-type thermoelements; a second set of metal links disposed on and in electrical and thermal communication with the third stage of thermoelements; and a second substrate layer disposed on the second set of metal links. The apparatus may also have a front end and a back end and the first stage thermoelement closest to the front end may be the same type as the second stage thermoelement closest to the front end and is the same type as the third stage thermoelement closest to the front end. The first stage thermoelement closest to the back end may also be the same type as the second stage thermoelement closest to the back end and is the same type as the third stage thermoelement closest to the back end. The thermoelements of the second stage may have greater electrical resistances than the thermoelements of the first stage. The n-type thermoelements may include a thermoelectric material of at least one of: alloys of bismuth telluride and bismuth selenide, $Bi_2Te_{2.7}Se_{0.3}$, P-doped SiGe, $YbAl_3$, P-doped Si, SiGe nanowires, rare earth tellurides, $La_3Te_4$, $Pr_3Te_4$, skutterudites, Ba—Yb—$CoSb_3$, chacogenides, Pb—Sb—Ag—Te, Pb—Te—Se, Mg—Ag—Sb, half-Heusler alloys, and Hf—Zr—Ni—Sn—Sb. The p-type thermoelements may include a p-type thermoelectric material of at least one of: alloys of bismuth telluride and antimony telluride, $Bi_{0.5}Sb_{1.5}Te_3$, B-doped SiGe, B-doped Si, SiGe nanowires, $Zn_4Sb_3$, skutterudites, $CeFe_{3.5}Co_{0.5}Sb_{12}$, Zintl compounds, $Yb_{14}MnSb_{11}$, rare earth tellurides, $Ce_3Te_4$, $MnSi_{1.73}$, SnSe, PbSbAgSnTe, $CePd_3$, $NaCo_2O_4$, half-Heusler alloys, and Nb—Ti—Fe—Sb—Sn. The n-type thermoelements may include $Bi_{2-x}Sb_xTe_3$ and the p-type thermoelements may include $Bi_2Te_{3-y}Se_y$, where x is between about 1.4 and 1.6 and y is between about 0.1 and 0.3. The apparatus may include a third set of metal links disposed between the first stage of thermoelements and the second stage of thermoelements; and a fourth set of metal links disposed between the second stage of thermoelements and the third stage of thermoelements. The substrate layer may be made of one of: a ceramic, an insulator and metal combination, and an insulator and semiconductor combination, wherein 1) the ceramic comprises at least one of: alumina $Al_2O_3$, aluminum nitride (AlN), berylium oxide (BeO), boron nitride (BN), diamond (C), silicon nitride (SiN), and sapphire (SiC); 2) in the insulator and metal combination, the insulator comprises at least one of: polymide, parylene, anodized aluminum, anodized molybdenum, CVD alumina, plated ceramics, and parylene or polymide-coated anodized alumina; and the metal comprises at least one of: aluminum, copper, nickel, molybdenum, molybdenum-copper alloy, tungsten-copper alloy, and copper-aluminum composite; and 3) in the insulator and semiconductor combination, the insulator comprises at least one of: thermal silicon oxide, CVD silicon oxide, and silicon nitride (SiN); and the semiconductor comprises one of: silicon and silicon carbide (SiC). The insulator may be equal to or less than about 10 micrometers thick. The metal links may be made of at least one of: 1) copper, 2) copper with a coating of nickel, gold, platinum/gold alloy, or silver, 3) nickel with a coating of gold, platinum/gold alloy, or silver. The structure of the n-type and p-type thermoelements may include a pair of metal layers; a pair of coating layers disposed between the metal layers; and one of an n-type and p-type thermoelectric material disposed between the pair of coating layers, and the coating layers may include at least one of: titanium tungsten (TiW), tantalum nitride (TaN), tantalum (Ta), and nickel (Ni).

Another embodiment according to the present disclosure includes a thermoelectric apparatus, the apparatus including: a series of middle unit cells connected in series and having a first side, a second side, a top side, and a bottom side; a front end cell in electrical communication with the first side of the series of middle unit cells; a back end cell in electrical communication with the second side of the series of middle unit cells; wherein each of the middle unit cells includes: two or more stages of alternating n-type and p-type thermoelements; a top plurality of metal links and a bottom plurality of metal links bracketing and in thermal and electrical communication with the two or more stages of alternating n-type and p-type thermoelements; and a top substrate layer and a bottom substrate layer bracketing the plurality of metal links; wherein the front end cell comprises: an n-type or p-type thermoelement selected to alternate with and in electrical communication with the series of middle unit cells; a metal link in electrical and thermal communication with the selected n-type or p-type thermoelement and the bottom substrate layer; and wherein the back end cell includes: an n-type or p-type thermoelement selected to alternate with and in electrical communication with the series of middle unit cells; and a metal link in electrical and thermal communication with the selected n-type or p-type thermoelement and the bottom substrate layer. The thermoelements of the second stage may have greater electrical resistances than the thermoelements of the first stage. The n-type thermoelements in the middle unit cells may have the same cross-sectional area as each other, and the p-type thermoelements in the middle unit cells have also the same cross-sectional area as each other. The n-type and p-type thermoelements, in some aspects, may have the same cross-sectional areas in the middle unit cells. The n-type thermoelements may include a thermoelectric material of at least one of: alloys of bismuth telluride and bismuth selenide, $Bi_2Te_{2.7}Se_{0.3}$, P-doped SiGe, $YbAl_3$, P-doped Si, SiGe nanowires, rare earth tellurides, $La_3Te_4$, $Pr_3Te_4$, skutterudites, Ba—Yb—$CoSb_3$, chacogenides, Pb—Sb—Ag—Te, Pb—Te—Se, Mg—Ag—Sb, half-Heusler alloys, and Hf—Zr—Ni—Sn—Sb. The p-type thermoelements may include a p-type thermoelectric material of at least one of: alloys of bismuth telluride and antimony telluride, $Bi_{0.5}Sb_{1.5}Te_3$, B-doped SiGe, B-doped Si, SiGe nanowires, $Zn_4Sb_3$, skutterudites, $CeFe_{3.5}Co_{0.5}Sb_{12}$, Zintl compounds, $Yb_{14}MnSb_{11}$, rare earth tellurides, $Ce_3Te_4$, $MnSi_{1.73}$, SnSe, PbSbAgSnTe, $CePd_3$, $NaCo_2O_4$, half-Heusler alloys, and Nb—Ti—Fe—Sb—Sn. The n-type thermoelements may include $Bi_{2-x}Sb_xTe_3$ and the p-type thermoelements may include $Bi_2Te_{3-y}Se_y$, where x is between about 1.4 and 1.6 and y is between about 0.1 and 0.3. The apparatus may include a third set of metal links disposed between the first stage of thermoelements and the second stage of thermoelements; and a fourth set of metal links disposed between the second stage of thermoelements and the third stage of thermoelements. The substrate layer may be made of one of: a ceramic, an insulator and metal combination, and an insulator and semiconductor combination, wherein 1) the ceramic comprises at least one of: alumina $Al_2O_3$, aluminum nitride (AlN), berylium oxide (BeO), boron nitride (BN), diamond (C), silicon nitride (SiN), and sapphire (SiC); 2) in the insulator and metal combination, the insulator comprises at least one of: polymide, parylene, anodized aluminum, anodized molybdenum, CVD alumina, plated ceramics, and parylene or polymide-coated anodized alumina; and the metal comprises at least one of: aluminum, copper, nickel, molybdenum, molybdenum-copper alloy, tungsten-copper alloy, and copper-aluminum composite; and 3) in the insulator and semiconductor combination, the insulator comprises at least one of: thermal silicon oxide, CVD silicon oxide, and silicon nitride (SiN); and the semiconductor comprises one of: silicon and silicon carbide (SiC). The insulator may be equal to or less than about 10 micrometers thick. The metal links may be made of at least one of: 1) copper, 2) copper with a coating of nickel, gold, platinum/gold alloy, or silver, 3) nickel with a coating of gold, platinum/gold alloy, or silver. The structure of the n-type and p-type thermoelements may include a pair of metal layers; a pair of coating layers disposed between the metal layers; and one of an n-type and p-type thermoelectric material disposed between the pair of coating layers, and the coating layers may include at least one of: titanium tungsten (TiW), tantalum nitride (TaN), tantalum (Ta), and nickel (Ni).

Another embodiment according to the present disclosure includes a method for making a thermoelectric apparatus, the method including: attaching a first series of alternating n-type and p-type thermoelements to a first set of metal links, such that each of first set of metal links connects one of the n-type thermoelements of the first series to one of the p-type thermoelements of the first series; attaching a second series of alternating n-type and p-type thermoelements to a second set of metal links, such that each of the second set of metal links connects one of the n-type thermoelements of the second series to one of the p-type thermoelements of the second series; and attaching the second series of alternating n-type and p-type thermoelements to the first series of alternating n-type and p-type thermoelements, such that each thermoelement in the second series is connected to at least one n-type thermoelement of the first series and at least one p-type thermoelement of the first series. The attaching steps may include forming a soldered connection. The thermoelements of the second stage may have greater electrical resistances than the thermoelements of the first stage. The apparatus may be organized into front, end, and middle unit cells, and all of the n-type thermoelements in the middle unit cells may have the same cross-sectional area, and wherein all of the p-type thermoelements in the middle unit cells have the same cross-sectional area. The n-type thermoelements in the middle unit cells may have the same cross-sectional area as the p-type thermoelements in the middle unit cells. The n-type thermoelements may include a thermoelectric material of at least one of: alloys of bismuth telluride and bismuth selenide, $Bi_2Te_{2.7}Se_{0.3}$, P-doped SiGe, $YbAl_3$, P-doped Si, SiGe nanowires, rare earth tellurides, $La_3Te_4$, $Pr_3Te_4$, skutterudites, Ba—Yb—$CoSb_3$, chacogenides, Pb—Sb—Ag—Te, Pb—Te—Se, Mg—Ag—Sb, half-Heusler alloys, and Hf—Zr—Ni—Sn—Sb. The p-type thermoelements may include a p-type thermoelectric material of at least one of: alloys of bismuth telluride and antimony telluride, $Bi_{0.5}Sb_{1.5}Te_3$, B-doped SiGe, B-doped Si, SiGe nanowires, $Zn_4Sb_3$, skutterudites, $CeFe_{3.5}Co_{0.5}Sb_{12}$, Zintl compounds, $Yb_{14}MnSb_{11}$, rare earth tellurides, $Ce_3Te_4$, $MnSi_{1.73}$, SnSe, PbSbAgSnTe, $CePd_3$, $NaCo_2O_4$, half-Heusler alloys, and Nb—Ti—Fe—Sb—Sn. The n-type thermoelements may include $Bi_{2-x}Sb_xTe_3$ and the p-type thermoelements may include $Bi_2Te_{3-y}Se_y$, where x is between about 1.4 and 1.6 and y is between about 0.1 and 0.3. The apparatus may include a third set of metal links disposed between the first stage of thermoelements and the second stage of thermoelements; and a fourth set of metal links disposed between the second stage of thermoelements and the third stage of thermoelements. The method may include steps of attaching the first set of metal links to a first substrate layer; and attaching the second set of metal links to a second substrate layer. The substrate layer may be made of one of: a ceramic, an insulator and metal combination, and an insulator and semiconductor combination, wherein 1) the ceramic comprises at least one of: alumina $Al_2O_3$, aluminum nitride (AlN), berylium oxide (BeO), boron nitride (BN), diamond (C), silicon nitride (SiN), and sapphire (SiC); 2) in the insulator and metal combination, the insulator comprises at least one of: polymide, parylene, anodized aluminum, anodized molybdenum, CVD alumina, plated ceramics, and parylene or polymide-coated anodized alumina; and the metal comprises at least one of: aluminum, copper, nickel, molybdenum, molybdenum-copper alloy, tungsten-copper alloy, and copper-aluminum composite; and 3) in the insulator and semiconductor combination, the insulator comprises at least one of: thermal silicon oxide, CVD silicon oxide, and silicon nitride (SiN); and the semiconductor comprises one of: silicon and silicon carbide (SiC). The insulator may be equal to or less than about 10 micrometers thick. The metal links may be made of at least one of: 1) copper, 2) copper with a coating of nickel, gold, platinum/gold alloy, or silver, 3) nickel with a coating of gold, platinum/gold alloy, or silver. The structure of the n-type and p-type thermoelements may include a pair of metal layers; a pair of coating layers disposed between the metal layers; and one of an n-type and p-type thermoelectric material disposed between the pair of coating layers, and the coating layers may include at least one of: titanium tungsten (TiW), tantalum nitride (TaN), tantalum (Ta), and nickel (Ni).

Another embodiment according to the present disclosure includes a method for making a thermoelectric apparatus, the method including: attaching a first series of alternating n-type and p-type thermoelements to a first set of metal links, such that each of first set of metal links connects one of the n-type thermoelements of the first stage to one of the p-type thermoelements of the first stage; attaching a second series of alternating n-type and p-type thermoelements to a second set of metal links such that each of the second set of metal links connects one of the n-type thermoelements of the second stage to one of the p-type thermoelements of the second stage; and attaching an intervening set of metal links to the first stage of alternating n-type and p-type thermoelements and the second stage of alternating n-type and p-type thermoelements such that each of the intervening set of metal links connects one of the n-type thermoelements of the first stage to one of the p-type thermoelements of the first stage and one of the n-type thermoelements of the second stage to one of the p-type thermoelements of the second stage. The attaching steps may include forming a soldered connection. The thermoelements of the second stage may have greater electrical resistances than the thermoelements of the first stage. The apparatus may be organized into front, end, and middle unit cells, and all of the n-type thermoelements in the middle unit cells may have the same cross-sectional area, and wherein all of the p-type thermoelements in the middle unit cells have the same cross-sectional area. The n-type thermoelements in the middle unit cells may have the same cross-sectional area as the p-type thermoelements in the middle unit cells. The n-type thermoelements may include a thermoelectric material of at least one of: alloys of bismuth telluride and bismuth selenide, $Bi_2Te_{2.7}Se_{0.3}$, P-doped SiGe, $YbAl_3$, P-doped Si, SiGe nanowires, rare earth tellurides, $La_3Te_4$, $Pr_3Te_4$, skutterudites, Ba—Yb—$CoSb_3$, chacogenides, Pb—Sb—Ag—Te, Pb—Te—Se, Mg—Ag—Sb, half-Heusler alloys, and Hf—Zr—Ni—Sn—Sb. The p-type thermoelements may include a p-type thermoelectric material of at least one of: alloys of bismuth telluride and antimony telluride, $Bi_{0.5}Sb_{1.5}Te_3$, B-doped SiGe, B-doped Si, SiGe nanowires, $Zn_4Sb_3$, skutterudites, $CeFe_{3.5}Co_{0.5}Sb_{12}$, Zintl compounds, $Yb_{14}MnSb_{11}$, rare earth tellurides, $Ce_3Te_4$, $MnSi_{1.73}$, SnSe, PbSbAgSnTe, $CePd_3$, $NaCo_2O_4$, half-Heusler alloys, and Nb—Ti—Fe—Sb—Sn. The n-type thermoelements may include $Bi_{2-x}Sb_xTe_3$ and the p-type thermoelements may include $Bi_2Te_{3-y}Se_y$, where x is between about 1.4 and 1.6 and y is between about 0.1 and 0.3. The apparatus may include a third set of metal links disposed between the first stage of thermoelements and the second stage of thermoelements; and a fourth set of metal links disposed between the second stage of thermoelements and the third stage of thermoelements. The method may include steps of attaching the first set of metal links to a first substrate layer; and attaching the second set of metal links to a second substrate layer. The substrate layer may be made of one of: a ceramic, an insulator and metal combination, and an insulator and semiconductor combination, wherein 1) the ceramic comprises at least one of: alumina $Al_2O_3$, aluminum nitride (AlN), berylium oxide (BeO), boron nitride (BN), diamond (C), silicon nitride (SiN), and sapphire (SiC); 2) in the insulator and metal combination, the insulator comprises at least one of: polymide, parylene, anodized aluminum, anodized molybdenum, CVD alumina, plated ceramics, and parylene or polymide-coated anodized alumina; and the metal comprises at least one of: aluminum, copper, nickel, molybdenum, molybdenum-copper alloy, tungsten-copper alloy, and copper-aluminum composite; and 3) in the insulator and semiconductor combination, the insulator comprises at least one of: thermal silicon oxide, CVD silicon oxide, and silicon nitride (SiN); and the semiconductor comprises one of: silicon and silicon carbide (SiC). The insulator may be equal to or less than about 10 micrometers thick. The metal links may be made of at least one of: 1) copper, 2) copper with a coating of nickel, gold, platinum/gold alloy, or silver, 3) nickel with a coating of gold, platinum/gold alloy, or silver. Examples of the more important features of the disclosure have been summarized rather broadly in order that the detailed description thereof that follows may be better understood and in order that the contributions they represent to the art may be appreciated. There are, of course, additional features of the disclosure that will be described hereinafter and which will form the subject of the claims appended hereto.

BRIEF DESCRIPTION OF THE DRAWINGS

For a detailed understanding of the present disclosure, reference should be made to the following detailed description of the embodiments, taken in conjunction with the accompanying drawings, in which like elements have been given like numerals, wherein:

FIG. 4A is a diagram of another metal-coupled two-stage thermoelectric converter according to another embodiment of the present disclosure;

FIG. 4B is a diagram of a unit cell for the metal-coupled two-stage thermoelectric converter of FIG. 4A;

FIG. 10A is a diagram showing a top view of an arrangement of metal links for the n-morph two-stage thermoelectric converter of FIG. 9A;

FIG. 10B is a diagram showing a top view of an arrangement of thermoelements on the metal links of FIG. 10A;

FIG. 10C is a diagram showing a top view of a second stage of thermoelements on top of the thermoelements of FIG. 10B;

FIG. 10D is a diagram showing a top view of a top arrangement of metal links covering the thermoelements of FIG. 10C;

DETAILED DESCRIPTION OF THE DISCLOSURE

Figure 1:
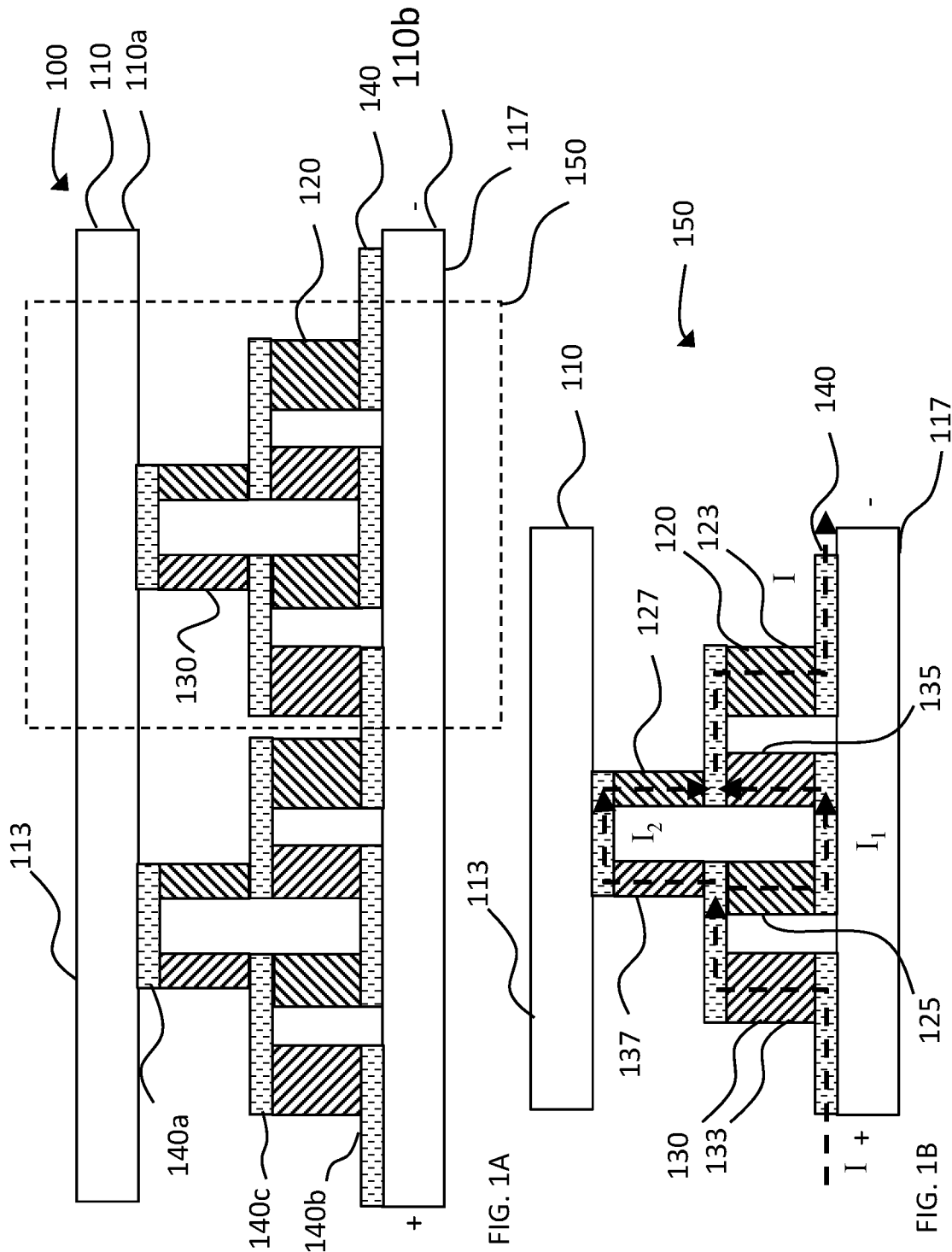
FIG. 1A is a diagram of a cross-section of a metal-coupled two-stage thermoelectric converter according to one embodiment of the present disclosure.
FIG. 1B is a diagram of a unit cell for the thermoelectric converter from FIG. 1A.

Generally, the present disclosure relates to apparatuses and methods for using converting a heat energy to electrical energy and converting electrical energy into heat energy, and, in particular, generating temperature differentials and generating electrical power. The present disclosure is susceptible to embodiments of different forms. They are shown in the drawings, and herein will be described in detail, specific embodiments of the present disclosure with the understanding that the present disclosure is to be considered an exemplification of the principles of the present disclosure and is not intended to limit the present disclosure to that illustrated and described herein.

The conditions of maximum cooling capability of a thermoelectric converter are different from the conditions of maximum efficiency of said thermoelectric converter. Maximum temperature difference, $\Delta T_{max}$, occurs at current $I_{max}$. The maximum current may be determined using the equation:

$$I_{max} = \frac{S(T_{hot} - \Delta T_{max})}{R} = \frac{ST_{cold(min)}}{R},$$

where S is the Seebeck coefficient for the pair of n-type and p-type thermoelements, $\Delta T = T_{hot} - T_{cold}$, and R is the electrical resistance for the pair of n-type and p-type thermoelements.

Cooling power of the thermoelectric converter may be expressed by the equation:

$$Q_c = SIT_{cold} - \frac{1}{2}I^2R - K\Delta T,$$

where K is the thermal conductance of a pair of n-type and p-type thermoelements.

For maximum Qc:

$$\frac{\partial Q_c}{\partial I} = 0,$$

and so $ST_{cold}-IR=0$

The coefficient of performance $$COP = \frac{Q_c}{P_e} = \frac{SIT_{cold} - \frac{1}{2}I^2R - K\Delta T}{SI\Delta T - I^2R}$$

The electrical resistances of each of the stages must be different, thus the flow of electric current will be different in each stage. The COP for a thermoelectric converter for cooling operation is defined as the ratio of heat pumped from the cold side to hot side of the cooler to the input electrical power. The optimal COP is determined by the following relationship:

$$\frac{\partial COP}{\partial I} = 0$$

$$COP_{opt} = \left(\frac{T_c}{\Delta T}\right)\left[\frac{\sqrt{1+Z\overline{T}} - \frac{T_{hot}}{T_{cold}}}{\sqrt{1+Z\overline{T}} + 1}\right]$$

$$I_{optimal} = \frac{S\Delta T}{R\sqrt{1+Z\overline{T}} - 1}$$

where the figure of merit $$Z = \frac{S^2}{KR} = \frac{\sigma S^2}{\lambda} \text{ and } \overline{T} = \frac{(T_{hot} + T_{cold})}{2}$$

$$I_{optimal} < I_{max}$$

The efficiency of a thermoelectric converter may be increased by organizing thermoelements to form multistage structures between the substrate layers. As the number of stages increase, so does the maximum temperature differential for the thermoelectric converter. Multistage thermoelectric converters may have two or more stages. In some embodiments, the stages may be separated by optional metal layers. In some embodiments, each thermoelement may include its own metal layer, negating the need for a separate intervening metal layer between thermoelements.

Each thermoelement stage will have a different $I_{optimal}$, thus the optimization of a multistage device requires tradeoffs between the performance of the individual stages, and one or more of the stages may be more efficient than one of the other stages.

FIG. 1A shows a schematic of a thermoelectric converter 100 for producing a temperature differential when electrically energized. The thermoelectric converter 100 includes a pair of thermally conducting electrically insulating (TCEI) substrate layers 110 (upper 110a and lower 110b. Between the substrate layers 110 are a plurality of p-type thermoelements 120 and a plurality of n-type thermoelements 130. Separating the thermoelements 120, 130 from each other and the substrate layers 110 are sets of metal links 140 (upper 140a and lower 140b and intervening 140c). In some embodiments, the metal links 140 alternate with the thermoelements 120, 130 and the substrate layers 110 in the direction from the hot side 117 to the cold side 113 of the thermoelectric converter 110. The p-type thermoelements 120 and the n-type thermoelements 130 alternate from the positive side to the negative side of the thermoelectric converter 100 and from the hot side 117 to the cold side 113. In some generator embodiments, the positive side first stage thermoelement may be an n-type thermoelement 130; however, in other cooler embodiments, the positive side, first stage thermoelement may be a p-type thermoelement. For reference, in all embodiments discussed in this disclosure, stages of thermoelements 120, 130 begin with the first stage that is closest to the hot side 117 and increase in ordinal numbering in the direction of the cold side 113. The thermoelements 120, 130 and metal links 140 may be arranged in unit cells 150. A plurality of unit cells 150 may be replicated between the substrate layers 110 from the positive end to the negative end of the thermoelectric converter 100. The unit cells 150 may be electrically connected to adjacent unit cells 150 through one or more of the metal links 140.

The n-type thermoelements 130 may be made of, but are not limited to, alloys of Bismuth Telluride and Bismuth Selenide such as $Bi_2Te_{2.7}Se_{0.3}$, P-doped SiGe, $YbAl_3$, P-doped Si and SiGe nanowires, rare earth tellurides such as $La_3Te_4$ and $Pr_3Te_4$, skutterudites such as Ba—Yb—$CoSb_3$, chacogenides such as Pb—Sb—Ag—Te, Pb—Te—Se, and Mg—Ag—Sb, and half-Heusler alloys such as Hf—Zr—Ni—Sn—Sb. The p-type thermoelements 120 may be made of, but are not limited to, alloys of Bismuth Telluride and Antimony Telluride such as $Bi_{0.5}Sb_{1.5}Te_3$, B-doped SiGe, B-doped Si and SiGe nanowires, $Zn_4Sb_3$, skutterudites such as $CeFe_{3.5}Co_{0.5}Sb_{12}$, Zintl compounds such as $Yb_{14}MnSb_{11}$, rare earth tellurides such as $Ce_3Te_4$, $MnSi_{1.73}$, SnSe, PbSbAgSnTe, CePd$_3$, NaCo$_2$O$_4$, half-Heusler alloys such as Nb—Ti—Fe—Sb—Sn. In some embodiments, the n-type and p-type thermoelements 130, 120 may include different ratios of Bismuth Telluride, Antimony Telluride, and Bismuth Selenium (Bi$_2$Te$_3$:Sb$_2$Te$_3$:Bi$_2$Se$_3$ in the ratio of, for example, 1:3:0 or 10:0:1). In some embodiments, a p-type thermoelement 120 may include Bismuth Antimony Telluride alloy (Bi$_{2-x}$Sb$_x$Te$_3$) and an n-type thermoelement 130 may include a Bismuth Tellurium Selenide alloy (Bi$_2$Te$_{3-y}$Se$_y$), where x and y vary between about 1.4-1.6 and about 0.1-0.3 respectively. The substrate layer 110 may include one of: a ceramic, an insulator and metal combination, and an insulator and semiconductor combination. Suitable ceramics may include, but are not limited to, one or more of: alumina Al$_2$O$_3$, aluminum nitride (AlN), berylium oxide (BeO), boron nitride (BN), diamond (C), silicon nitride (SiN), and sapphire (SiC). Suitable insulator and metal combinations may include, but are not limited to, an insulator made of one of: polymide, parylene, anodized aluminum, anodized molybdenum, CVD alumina, plated ceramics, and parylene or polymide-coated anodized alumina combined with a metal made of one of: aluminum, copper, nickel, molybdenum, molybdenum-copper alloy, tungsten-copper alloy, and copper-aluminum composite. In some embodiments, the insulator layer may have a thickness of less than 10 micrometers. Suitable insulator and semiconductor combinations may include, but are not limited to, an insulator made of one of: thermal silicon oxide, CVD silicon oxide, and silicon nitride (SiN) combined with a semiconductor made of one of: silicon and silicon carbide (SiC). The selection of a substrate layer material may impact performance and reliability of the thermoelectric converter 100 due to heat expansion coefficients of the materials used. The metal links 140 may be made of one of: copper, a copper or nickel layer with nickel/gold coating, a copper or nickel layer with platinum/gold alloy, gold, or silver.

FIG. 1B shows a diagram of a unit cell 150 from FIG. 1A. The current paths, shown by the dashed line and arrows, indicates the splitting and combination of current as electricity moves from positive to negative through the unit cell 150. According to Kirchoff's law, $I=I_1+I_2$. In the case of the unit cell 150, $I_1>I_2$ due to the arrangement and dimensions of the thermoelements 125, 135, 137, and 127. The n-type thermoelements 130 include thermoelement 133, thermoelement 135, and thermoelement 137, each of which have different electrical resistance. In some embodiments, the different electrical resistances are achieved by the thermoelements 133, 135, 137 having different cross-sectional areas (which appears a difference in width in the side view). As shown, the cross-sectional area of the thermoelement 133 is greater than the cross-sectional area of the thermoelement 135. The cross-sectional area of thermoelement 137 is less than the cross-sectional area of either thermoelements 133 and 135. Likewise, the p-type thermoelements 120 include thermoelement 123, thermoelement 125, and thermoelement 127, each of which have different electrical resistance. In some embodiments, the different electrical resistances are achieved by the thermoelements 123, 125, 127 having different cross-sectional area (which appears a difference in width in the side view). The cross-sectional area of the thermoelement 123 is greater than the cross-sectional area of the thermoelement 125. The cross-sectional area of thermoelement 127 is less than the cross-sectional area of either thermoelements 123 and 125. The different cross-sectional areas of the thermoelements 123, 125, 127, 133, 135, 137 correspond to the different resistances, and, thus, amounts of electrical currents passing through the respective elements, where $I>I_1>I_2$. The thermoelements 123, 133 may be sized larger for higher COPs and $\Delta T_{max}$. Also, the ratio of cross-sections of p-type elements 125, 127 and n-type elements 135, 137 may be changed to increase or decrease the COPs and $\Delta T_{max}$. In some embodiments, the different resistances in thermoelements 123, 125, 127, 133, 135, 137 may be achieved by varying the thicknesses of the thermoelements 123, 125, 127, 133, 135, 137 as would be understood by a person of skill in the art.

Figure 2:
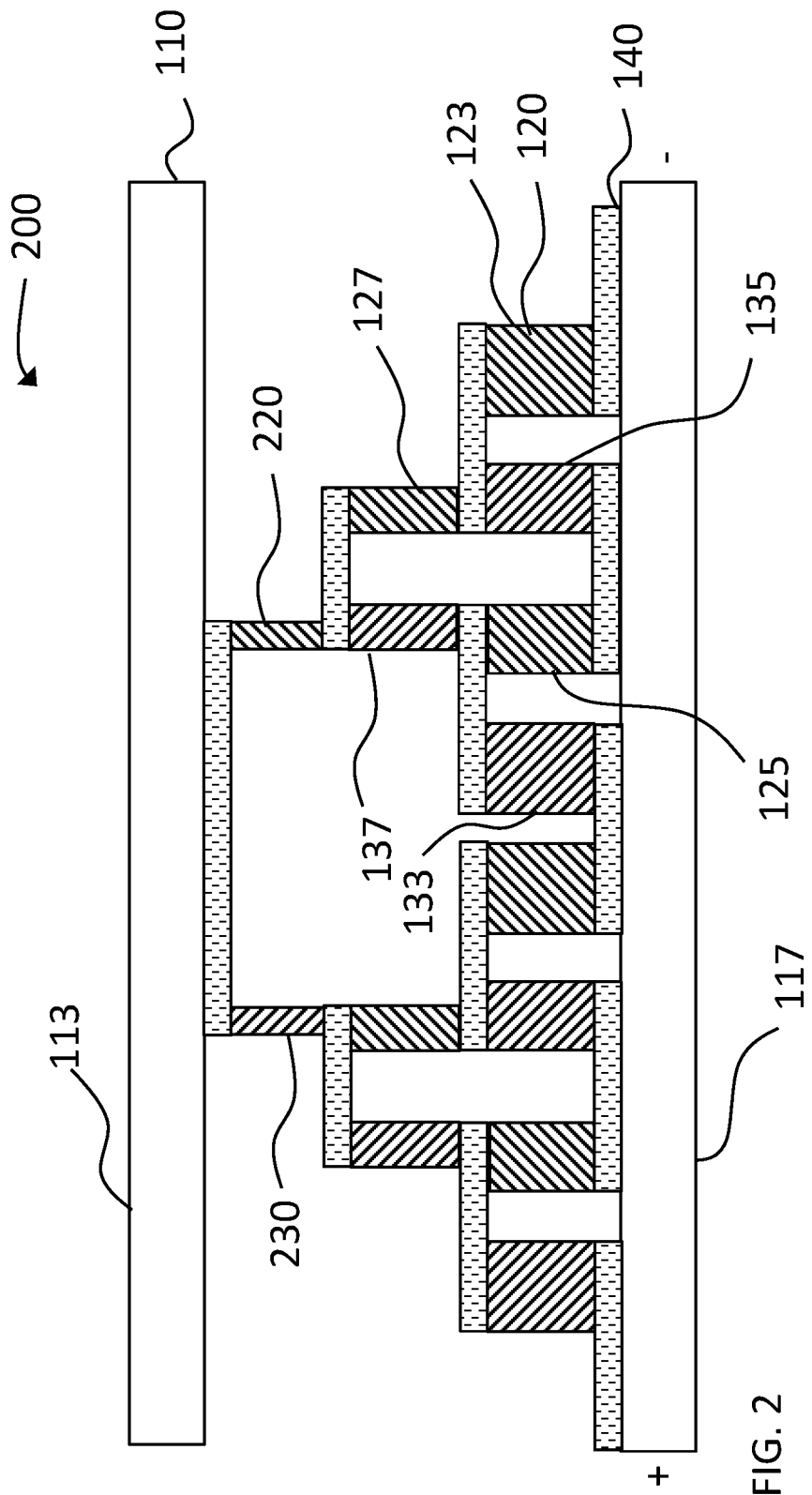
FIG. 2 is a diagram of an arrangement of thermoelements for a metal-coupled three-stage thermoelectric converter according to one embodiment of the present disclosure.

FIG. 2 shows a diagram of an arrangement of thermoelements 120, 130 for a three-stage thermoelectric converter 200. The thermoelements 123, 125, 133, 135 make up the first stage, the thermoelements 127, 137 make up the second stage, and thermoelements 220, 230 make up the third stage. As shown, the thermoelement 220 is p-type and the thermoelement 230 is n-type, though the thermoelement types may be switched to correspond with changes other thermoelements and the mode of operation (cooler or generator), as would be understood by a person of skill in the art. In some embodiments, the thermoelements 220, 230 in the third stage may have greater electrical resistances than the thermoelements 127, 137 in the second stage, and the electrical current passing through the thermoelements 220, 230 will be less than the electrical current through the thermoelements 127, 137. In some embodiments, the thermoelements 220, 230 in the third stage may have smaller cross-sectional areas and/or greater thicknesses than the thermoelements 127, 137 in the second stage.

Figure 3:
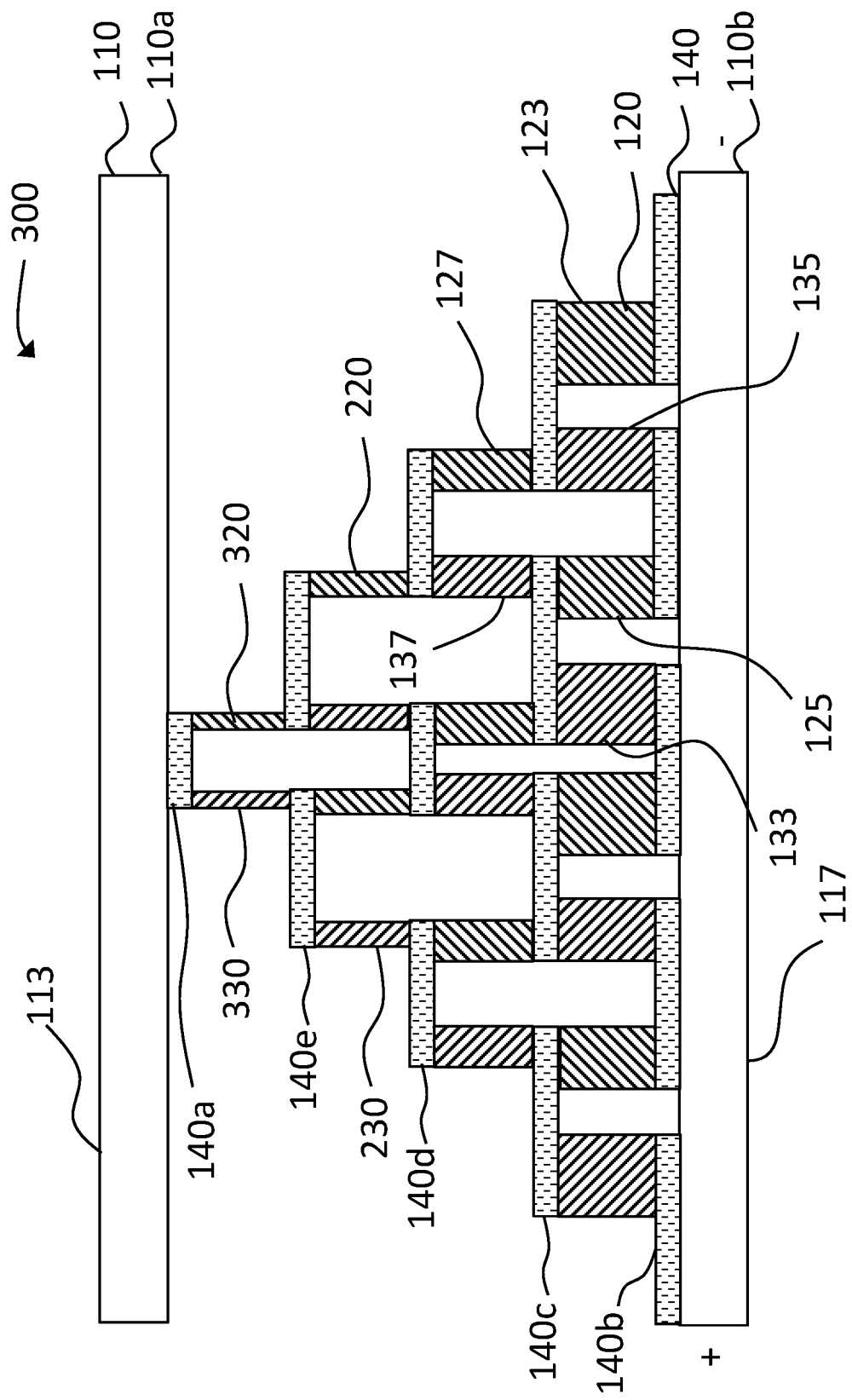
FIG. 3 is a diagram of an arrangement of thermoelements for a metal-coupled four-stage thermoelectric converter according to one embodiment of the present disclosure.

FIG. 3 shows a diagram of an arrangement of thermoelements 120, 130 for a four-stage thermoelectric converter 300. The thermoelements 123, 125, 133, 135 make up the first stage, the thermoelements 127, 137 make up the second stage, the thermoelements 220, 230 make up the third stage, and thermoelements 320, 330 make up the fourth stage. As shown, the thermoelement 320 is p-type and the thermoelement 330 is n-type, though the thermoelement types may be switched to correspond with changes other thermoelements and the mode of operation (cooler or generator), as would be understood by a person of skill in the art. In some embodiments, the thermoelements 320, 330 in the fourth stage may have greater electrical resistances than the thermoelements 220, 230 in the third stage, and the electrical current passing through the thermoelements 320, 330 will be less than the electrical current through the thermoelements 220, 230. smaller cross-sectional areas. The stages of the thermoelements 123, 125, 127, 133, 135, 137, 220, 230, 320, 330 may have intervening sets of metal links 140a, 140b, 140c, 140d, 140e.

FIG. 4A shows a diagram of another embodiment of a thermoelectric converter 400 with two temperature stages and metal links 140c between the thermoelements 120, 130 of each stage. The thermoelements 120, 130 and alternating metal links 140 are disposed between substrate layers 110. The arrangement of thermoelements 120, 130 and metal links 140 form a unit cell 450, which can be repeated multiple times between the positive and negative ends of the thermoelectric converter 400.

FIG. 4B shows a diagram of a unit cell 450 from FIG. 4A. The current paths, shown by the dashed line and arrows, indicates the splitting and combination of current as electricity moves from positive to negative terminals through the unit cell 450. Again, $I=I_1+I_2$. In the case of the unit cell 450, $I_1>I_2$ due to the arrangement and dimensions of the thermoelements 120, 130. In some embodiments, the n-type thermoelements 133, 135, 137 and the p-type thermoelements 123, 125, 127 may have different electrical resistances, which may be accomplished though different cross-sectional areas (which appears a difference in width in the side view) or thicknesses of the thermoelements 133, 135, 137, 123, 125, 127. The cross-sectional area of the thermoelement 133 is greater than the cross-sectional area of the thermoelement 135. The cross-sectional area of thermoelement 137 is less than the cross-sectional area of either thermoelements 133 and 135. Likewise, the p-type thermoelements 120 include thermoelement 123, thermoelement 125, and thermoelement 127, each of which have a different cross-sectional area (which appears a difference in width in the side view). The cross-sectional area of the thermoelement 123 is greater than the cross-sectional area of the thermoelement 125. The cross-sectional area of thermoelement 127 is less than the cross-sectional area of either thermoelements 123 and 125. The different cross-sectional areas of the thermoelements 123, 125, 127, 133, 135, 137 correspond to the different amounts of electrical currents passing through the respective elements, where $I > I_1 > I_2$.

Figure 5A:
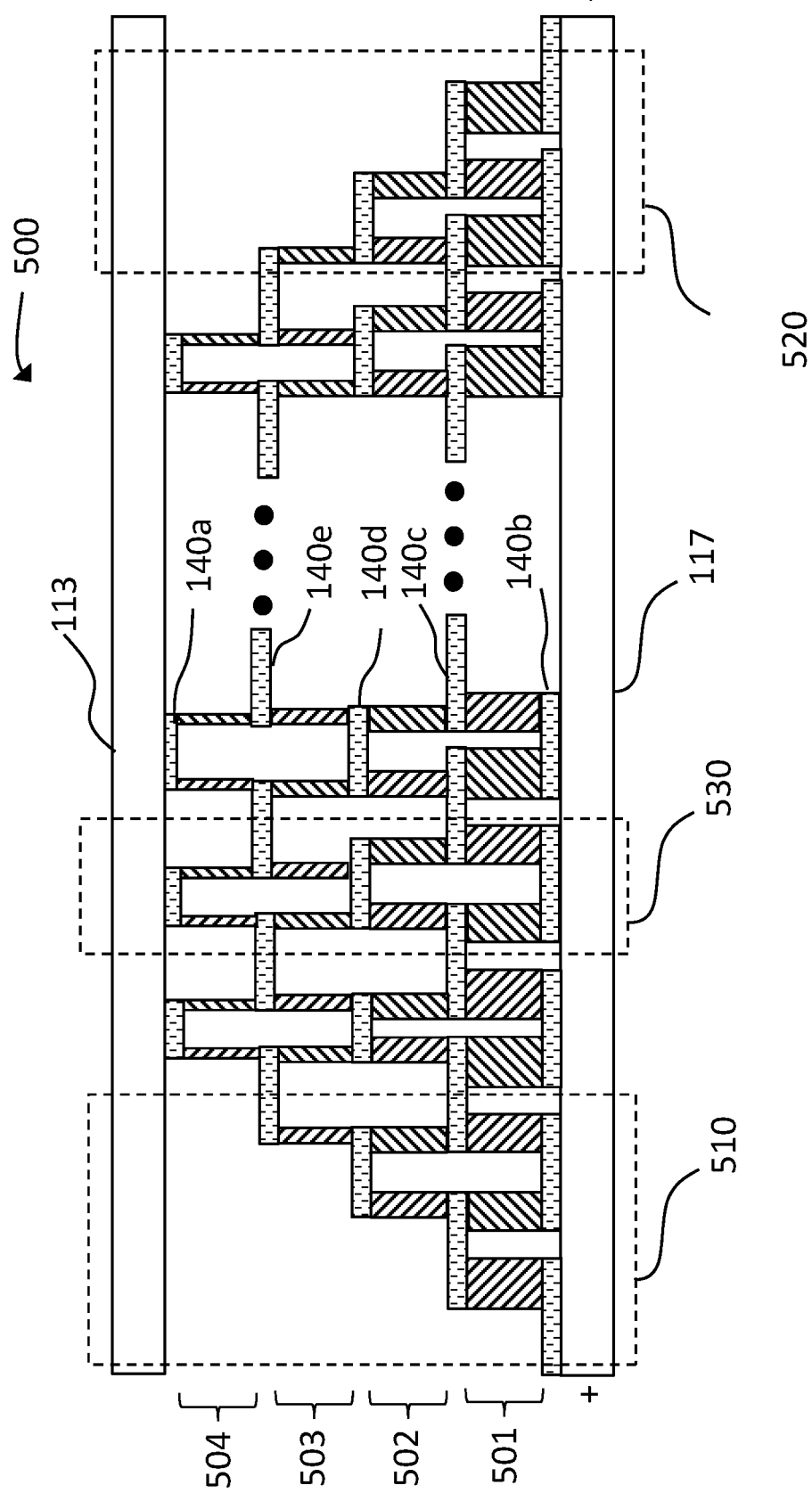
FIG. 5A is a diagram of a metal-coupled four-stage thermoelectric converter based on the embodiment of FIG. 4A.

FIG. 5A is a diagram of a four stage thermoelectric converter 500 based on the arrangement of the thermoelements 120, 130 and the metal links 140c, 140d, 140e between substrate layers 110 from FIG. 4A. The structure of the thermoelectric converter 500 can be broken down into individual unit cells 510, 520, 530. The front unit cell 510 includes the thermoelements 120, 130 and the metal links 140 and the corresponding sections of substrate layer 110 on the positive side of the converter 500 that do not include the topmost (in this case fourth) stage. The end unit cell 520 includes the thermoelements 120, 130 and the metal links 140 and the corresponding sections of substrate layer 110 on the negative side of the converter 500 that do not include the topmost (in this case fourth) stage. The middle unit cell 530 includes the thermoelements 120, 130 and the metal links 140 and the corresponding sections of substrate layer 110 that can be repeated between the front unit cell 510 and the end unit cell 520. Since the only open space between the substrate layers 110 is in the front unit cell 510 and the end unit cell 520, then the more middle unit cells 530 that are present means that space between the substrate layers 110 is more efficiently used, which is a benefit in the manufacture of the thermoelectric converter 500.

In some embodiments, each stage of the thermoelectric converter 500 may use thermoelements with different composition to cover different temperature ranges. For example, starting with the first stage 501 (the layer of thermoelements 120, 130 nearest to the hot side 117), the thermoelements may include nanostructured Bi—Sb—Te—Se for temperatures between 40 degrees C. and 100 degrees C. The second stage 502 may include crystalline zone-melted Bi—Sb—Te—Se for temperatures −30 degrees C. to 50 degrees C. The third stage 503 may include alkali-doped Cs—Bi—Sb—Te for temperatures −100 degrees C. to −20 degrees C. The fourth stage 504 may include Bi—Sb alloys for temperatures below −70 degrees C.

Figure 5B:
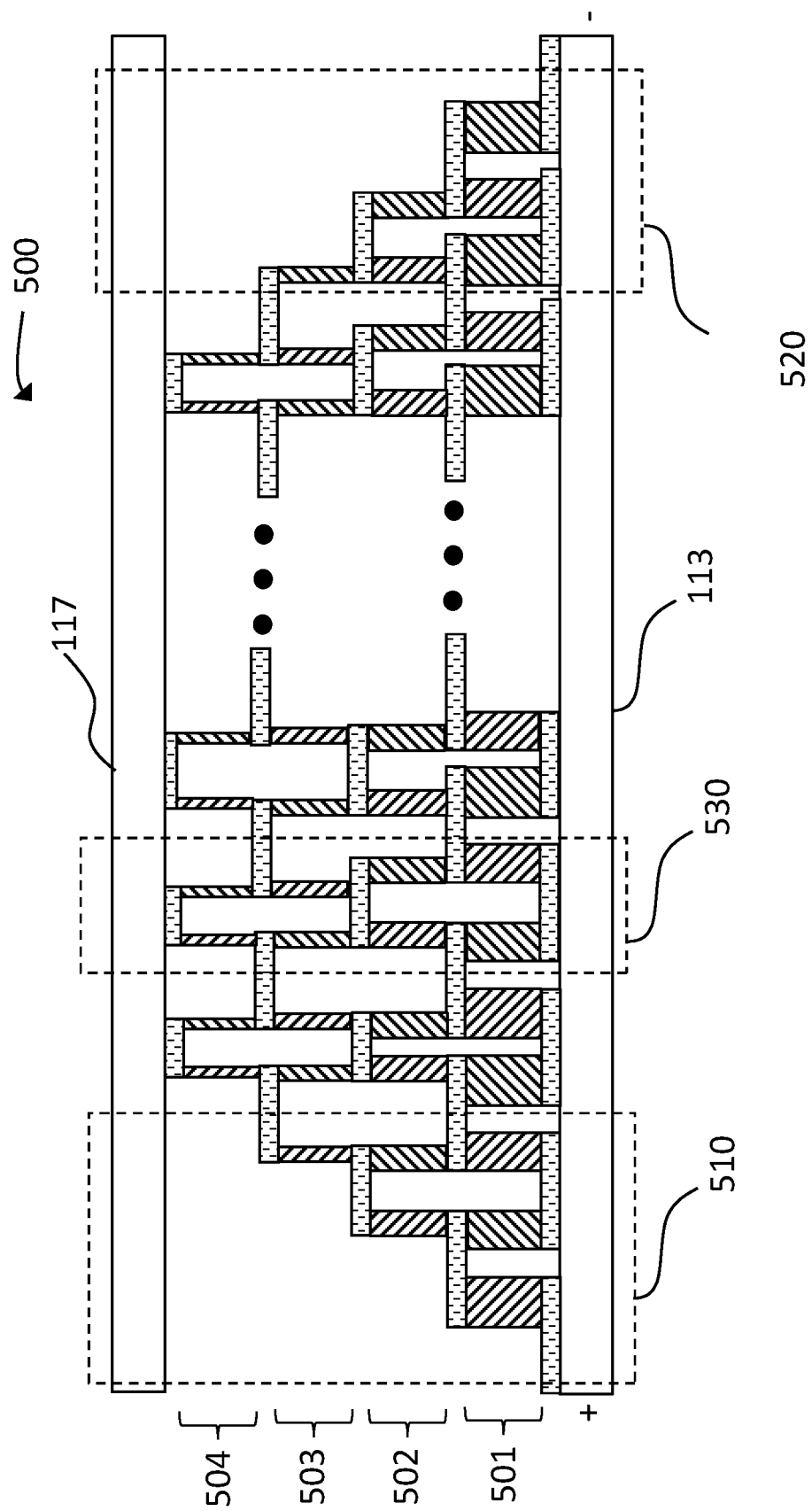
FIG. 5B is a diagram of a metal-coupled four-stage thermoelectric converter based on the embodiment of FIG. 4A in power generation configuration.

FIG. 5B shows another embodiment of the thermoelectric converter 500, which is now configured for power generation and use a different set of thermoelement stages. As a generator, the front and end stages are in contact with the cold side 113 rather than the hot side 117 of the thermoelectric converter 500. Thus, the first stage 501 starts at the cold side 113, and the ordinal stage numbers increase toward the hot side. The first stage 501 may include nanostructured Bi—Sb—Te—Se, Pb—Te, or Zn—Sb for temperatures 100 degrees C. to 400 degrees C. The second stage 502 may include skutterudites, Mg—Si—Mn, or SnSe for temperatures 300 degrees C. to 500 degrees C. The third stage 503 may include half-Heusler alloys for temperatures 400 degrees C. to 600 degrees C. The fourth stage 504 may include SiGe or rare earth tellurides such as $Pr_3Te_4$ for temperatures 500 degrees C. to 1100 degrees C.

Figure 6:
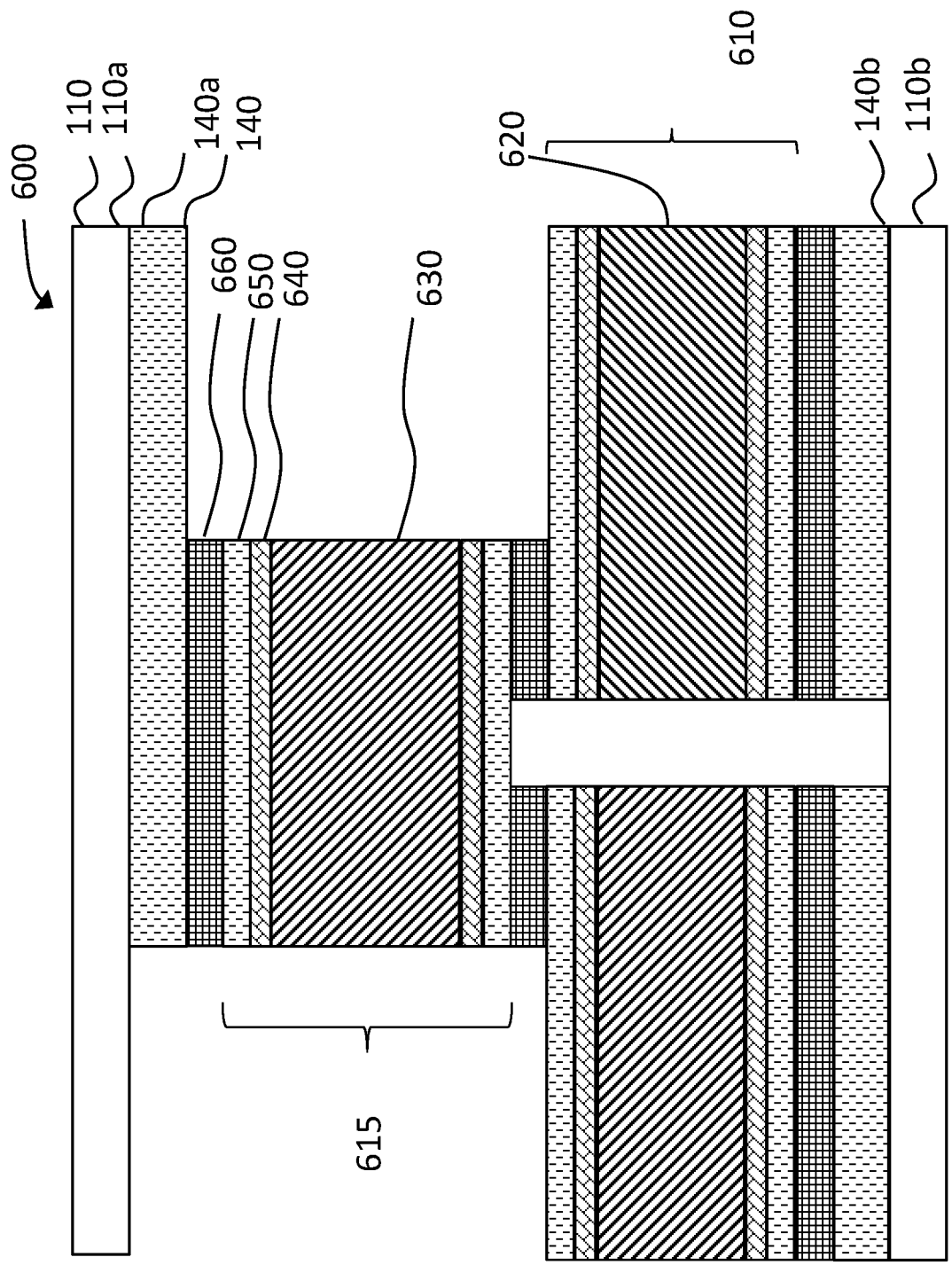
FIG. 6 is a diagram of a π-morph bridge thermoelectric unit according to one embodiment of the present disclosure.

FIG. 6 shows a diagram of a two-stage thermoelectric converter structure, herein referred to as a π-morph bridge 600, which does not use metal links 140 between stages. The π-morph bridge 600 includes the substrate layers 110 with metal links 140 disposed adjacent to and between each of the substrate layers 110. A p-type thermoelement 610 and an n-type thermoelement 615 are disposed between the metal links 140 and in electrical and thermal communication with one another. The p-type thermoelement includes a p-type thermoelectric material 620 between coating layers 640 which are between metal layers 650. An optional solder layer 660 may connect the metal layer 650 to the metal link 140. The n-type thermoelement includes an n-type thermoelectric material 630 between coating layers 640 which are between metal layers 650. An optional solder layer 660 may connect the metal layer 650 to the metal link 140. The n-type thermoelectric material 630 may be one of the same materials used in the thermoelement 130, and the p-type thermoelectric material 620 may be one of the same materials that is used in the thermoelement 120. The coating layer 640 may be made of any electroplatable metal or a barrier layer (TiW or TaN/Ta) deposited by physical vapor deposition (PVD) sputtering. In some embodiments, a suitable electroplatable metal is nickel. In some embodiments, the coating layers 640 may be about 10 micrometers thick. The metal layer 650 may be made of copper or silver. In some embodiments, the metal layer 650 may be about 50 micrometers thick. In some embodiments, an optional solder layer 660 may be disposed between the adjacent metal layers 650. The removal of the metal links 140 between stages of a multistage thermoelectric converter reduces difficulties in fabrication.

Figures 7A, 7B:
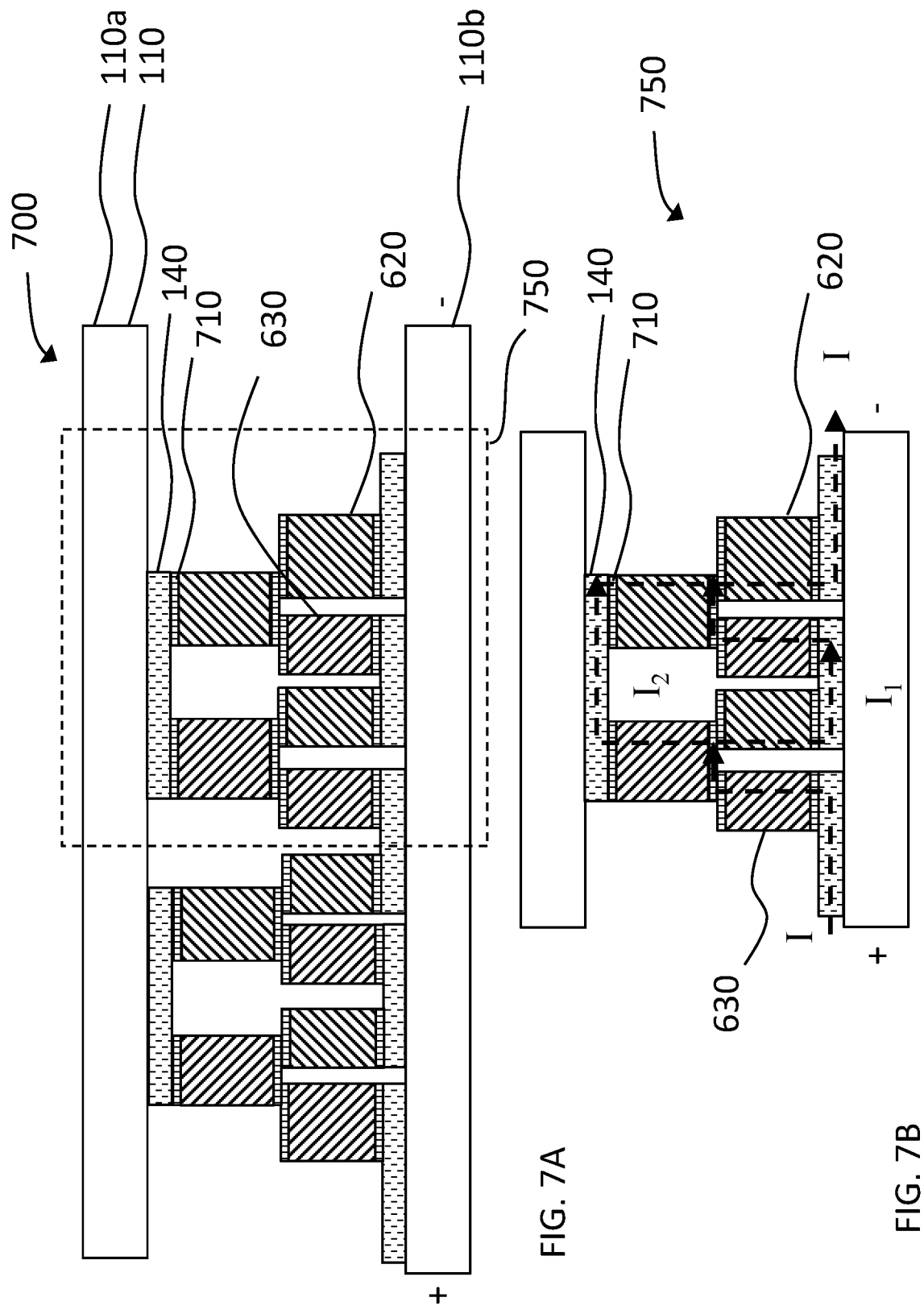
FIG. 7A is a diagram of a π-morph two-stage thermoelectric converter according to one embodiment of the present disclosure.
FIG. 7B is a diagram of a unit cell from the π-morph two-stage thermoelectric converter of FIG. 7A.

FIG. 7A shows a diagram of a two-stage π-morph bridge thermoelectric converter 700. The thermoelectric converter 700 includes the substrate layers 110a, 110b with the metal links 140a, 140b adjacent and interior to the pair of substrate layers 110. The thermoelements 620, 630 are sandwiched between layers 710. The layer 710 is made up of the coating layer 640 and the metal layer 650 and arranged so that the coating layer 640 is in contact with the thermoelement 620, 630. In some embodiments, the layer 710 may be substantially thicker than typical coating or plating layers of prior art thermoelements (about 50 micrometers versus about 1 micrometer). One end of each thermoelement 620, 630 is shown in contact with the metal links 140 because this is a two-stage converter. A unit cell 750 is shown and includes two π-morph bridge structures, where the n-type and p-type thermoelectric materials have been switched for forming a balanced pair.

FIG. 7B shows the unit cell 750 to the π-morph thermoelectric converter 700. The current paths, shown by the dashed line and arrows, indicates the splitting and combination of current as electricity moves from positive to negative through the unit cell 750. Again, $I = I_1 + I_2$. In the case of the unit cell 750, $I_1 > I_2$ due to the arrangement and dimensions of the thermoelements 620, 630. In some embodiments, the n-type thermoelements 630 and the p-type thermoelements 620 may have different electrical resistances, which may be accomplished by having different cross-sectional areas (which appears a difference in width in the side view) or thicknesses. The different electrical resistances of the thermoelements 620, 630 correspond to the different amounts of electrical currents passing through the respective elements, where $I > I_1 > I_2$.

Figure 8:
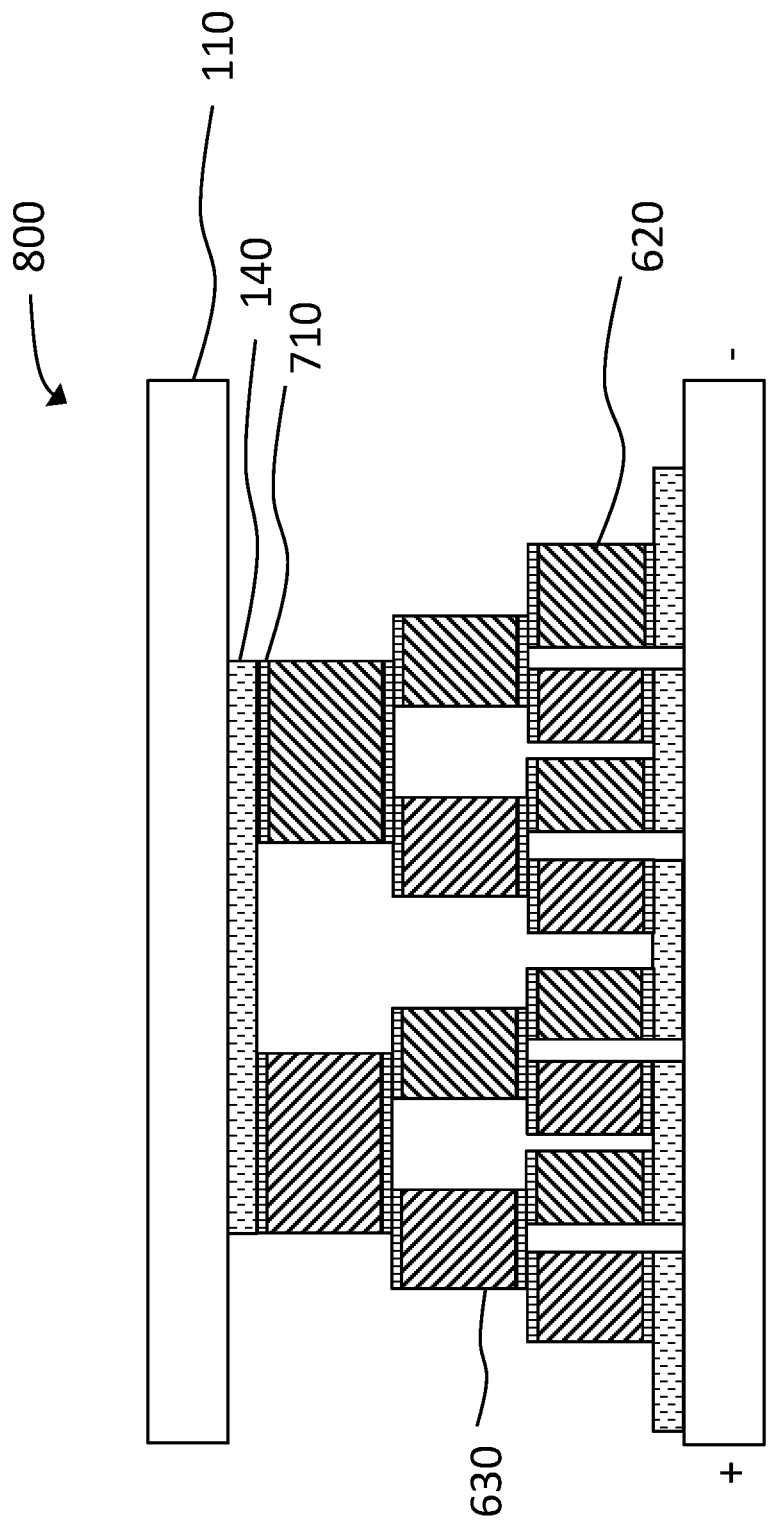
FIG. 8 is a diagram of a π-morph three-stage variant of the thermoelectric converter of FIG. 7A.

FIG. 8 shows a diagram of a three-stage π-morph thermoelectric converter 800. The thermoelectric converter 800 includes a third stage of thermoelements disposed between the metal links 140 and the second stage. The third stage thermoelements 620, 630 may be elongated to span the distances between the second stage thermoelements 620, 630. The metal links 140 are shown disposed between the thermoelements 620, 630 in the third stage and the upper substrate layer 110a and between the thermoelements 620, 630 in the first stage and the lower substrate layer 110b. The thermoelements 620, 630 of the second stage are adjacent to the thermoelements 620, 630 of the first stage and the third stage without intervening metal links 140. The thermoelements 620, 630 in the third stage are elongated to bridge the thermoelements 620, 630 of the second stage. The third stage thermoelements 620, 630 may have higher electrical resistances than the second-stage thermoelements 620, 630. Since the third stage thermoelements 620, 630 have a larger cross-sectional area due to elongation, their thickness may also be increased such that the electrical resistance in of the third stage thermoelements are greater.

Figures 9A, 9B:
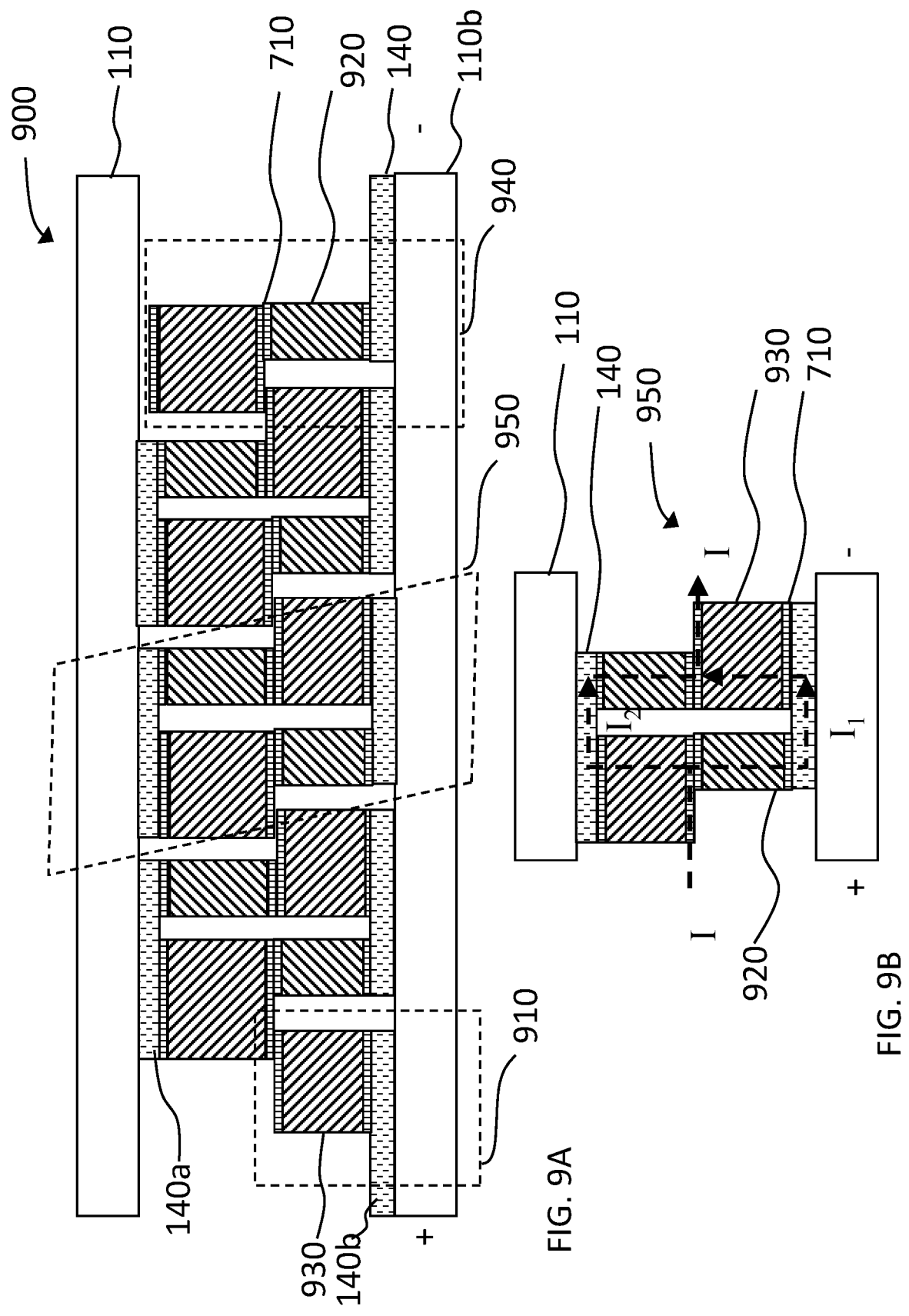
FIG. 9A is a diagram of a π-morph two-stage thermoelectric converter according to another embodiment of the present disclosure.
FIG. 9B is a diagram of a unit cell from the π-morph two-stage thermoelectric converter of FIG. 9A.

FIG. 9A shows a diagram of another embodiment of a two-stage π-morph thermoelectric converter 900. The thermoelectric converter 900 includes alternating n-type thermoelements 930 and p-type thermoelements 920. The thermoelectric converter 900 includes the substrate layers 110 with the metal links 140 adjacent and interior to the pair of substrate layers 110. The thermoelements 920, 930 are sandwiched between layers 710. The layer 710 is made up of the coating layer 640 and the metal layer 650 and arranged so that the coating layer 640 is in contact with the thermoelement 620, 630. One end of each thermoelement 920, 930 is shown in contact with the metal links 140 because this is a two-stage converter. These thermoelements 920, 930 may be made of the same materials as the thermoelements 620, 630; however, the thermoelements 920, 930 may be dimensioned to have uniform cross-sectional areas for each thermoelement. As shown, the p-type thermoelements 920 are always thinner in width than the n-type thermoelements 930. This means that a middle unit cell 950 structure may be different from the unit cell 750 shown in FIGS. 7A and 7B. Additionally, the thermoelements 920, 930 in the second stage have higher electrical resistances than their counterparts in the first stage. In some embodiments, the thermoelements 920, 930 in the second stage may be thicker than the thermoelements 920, 930 in the first stage. The front cell 910 and the end cell 920 may each consist of only one thermoelement 930, 920, respectively and a metal link 140 disposed between the thermoelement 930, 920 and the substrate layer 110 on the hot side of the thermoelectric converter 900.

FIG. 9B shows the middle unit cell 950 to the π-morph thermoelectric converter 900. The current paths, shown by the dashed line and arrows, indicates the splitting and recombination of current as electricity moves from positive to negative through the unit cell 950. Again, $I=I_1+I_2$. In the case of the unit cell 950, $I_1>I_2$ due to the arrangement and dimensions of the thermoelements 920, 930, such that the electrical resistances in the second stage thermoelements 920, 930 are greater than the electrical resistance in the first stage thermoelements 920, 930. The n-type thermoelements 930 may have uniform cross-sectional areas, and the p-type thermoelements 920 may have uniform cross-sectional areas; however, the cross-sectional areas will be different between the n-type thermoelement 930 and the p-type thermoelements 920 (which appears a difference in width in the side view). The different cross-sectional areas of the thermoelements 920, 930 correspond to the different amounts of electrical currents passing through the respective elements, where $I>I_1>I_2$.

FIGS. 10A-10D shows diagrams of the addition of layers to form the thermoelectric converter 900 during fabrication. FIG. 10A shows the metal links 140 for the laid out over the substrate layer 110 for the hot side 117 of the thermoelectric converter 900. FIG. 10B shows the addition of the first stage thermoelements 920, 930 disposed on the upper surface of the metal links 140 disposed on the substrate layer 110 for the hot side 117. FIG. 10C shows the disposition of the second stage thermoelements 920, 930 on top of the first stage thermoelements 920, 930. FIG. 10D shows the application of the metal links 140 on top of the second stage thermoelements 920, 930 such that the substrate layer 110 for the cold side 113 may be applied on top of the metal links 140.

Figure 11:
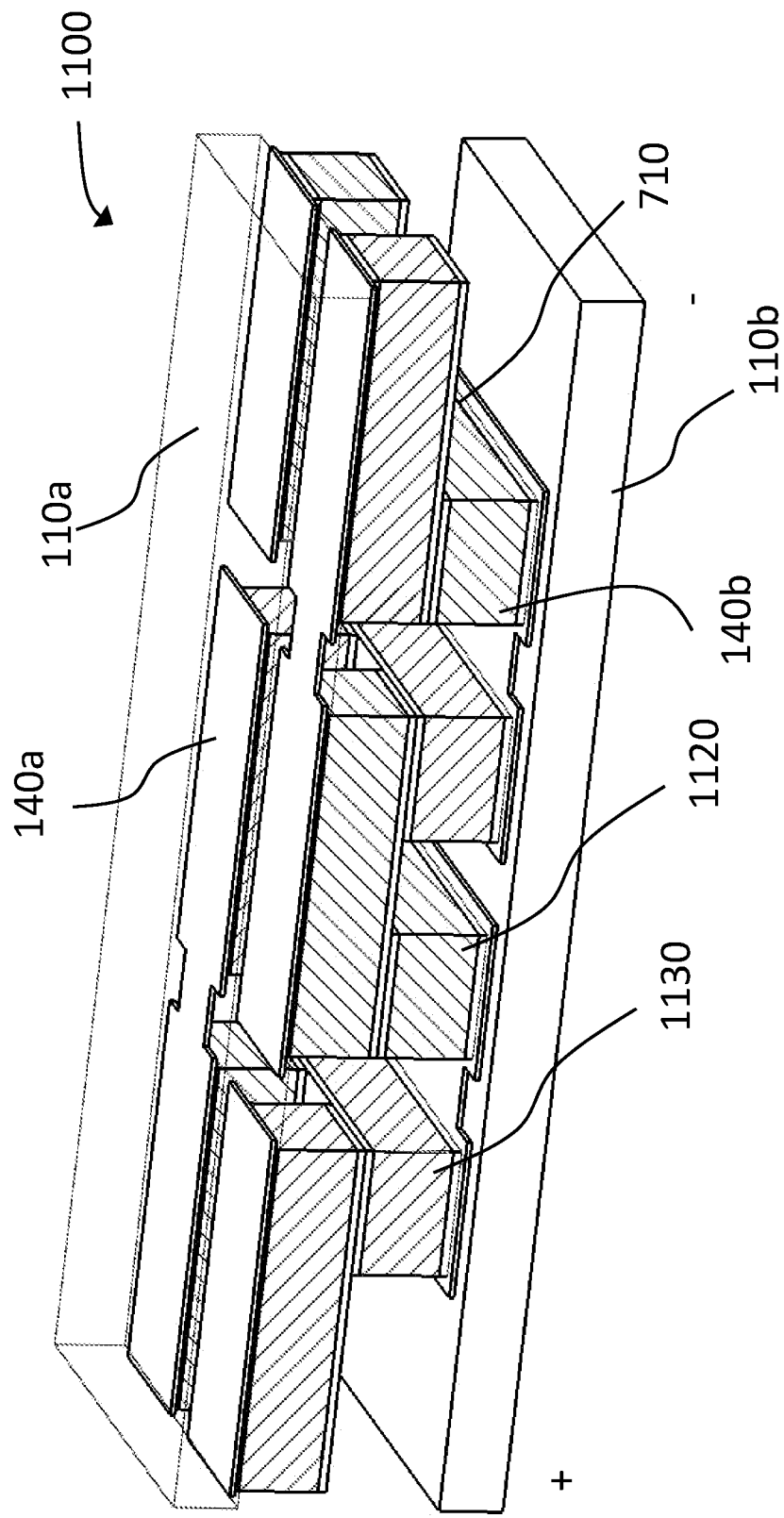
FIG. 11 is a three-dimensional diagram of a middle section of a π-morph two-stage thermoelectric converter according to another embodiment of the present disclosure.

FIG. 11 shows a diagram of a two-stage π-morph thermoelectric converter 1100. The thermoelectric converter 1100 includes n-type thermoelements 1130 and p-type thermoelements 1120. While the thermoelements 1120, 1130 may be similar or the same in composition as the thermoelements 920, 930, the thermoelements 1120, 1130 may also be uniform in cross-sectional area. However, the second stage thermoelements 1120, 1130 are thicker than the first stage thermoelements 1120, 1130 such that the electrical resistance in the second stage is greater than the electrical resistance in the first stage. Also, the thermoelements 1120, 1130 may be configured in arrangements that do not require alternation between n-type and p-type for every single thermoelement 1120, 1130. This means that a middle unit cell structure may be different from the unit cells 750, 950. The thermoelectric converter 1100 includes the substrate layers 110 with the metal links 140 adjacent and interior to the pair of substrate layers 110. The thermoelements 1120, 1130 are sandwiched between layers 710. The layer 710 is made up of the coating layer 640 and the metal layer 650 and arranged so that the coating layer 640 is in contact with the thermoelement 1120, 1130. The layers 710 of thermoelements 1120, 1130 may be optionally soldered or brazed for form a bond. In some embodiments for coolers, the layers 710 of thermoelements 1120, 1130 may be soldered by a suitable solder, such as one of. BiSn, PbSn, Sn—Ag—Cu, nano-Ag, and Au—Sn solders. In some embodiments for power generators, the layers 710 of thermoelements 1120, 1130 may be brazed using a suitable filler metal, such as one of: nano-Ag, nano-Au, Cu—Ni—Zn Ag—Cu, and Pt—Ag alloys. One end of each thermoelement 1120, 1130 is shown in contact with the metal links 140 because this is a two-stage thermoelectric converter. Again, the resistance of the thermoelements 1120, 1130 in the lower (first) stage (attached to the metal links 140 adjacent to the substrate layer 110 on the hot side 117 of the thermoelectric converter 1100 are designed to be lower than the resistance of thermoelements 1120, 1130 of the upper (second) stage that is attached to the substrate layer 110 on the cold side 113 of the thermoelectric converter 1100. In some embodiments the resistances are varied by changing the thicknesses of the thermoelements 1120, 1130. The π-morph structure results in symmetric cell layouts and provides redundant electrical paths for fault-tolerant operation. The fault-tolerant design enhances the reliability and the mean time between failures of the thermoelectric converter 1100.

Figure 12:
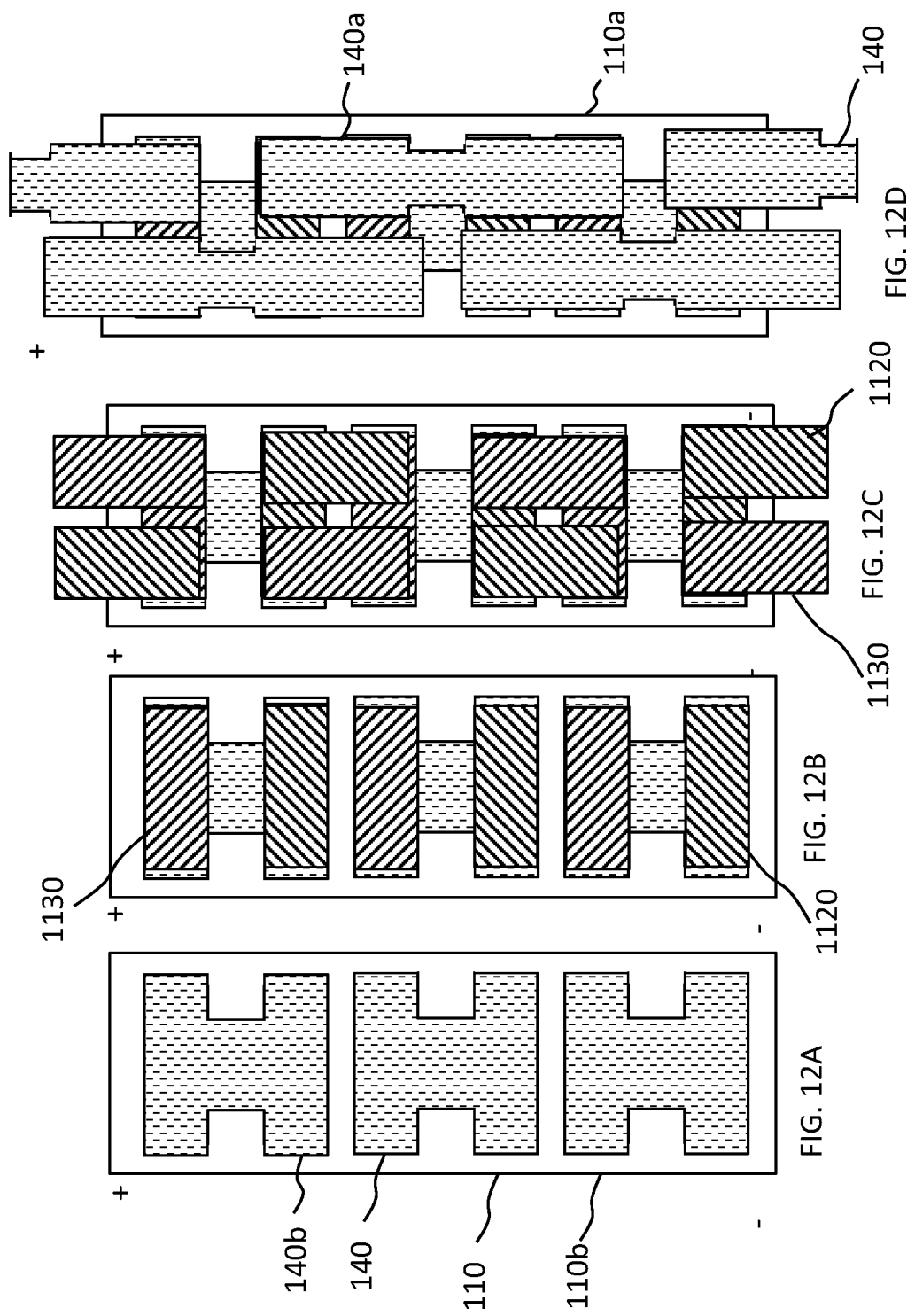
FIG. 12A is a diagram showing a top view of an arrangement of metal links for a middle section of the π-morph two-stage thermoelectric converter of FIG. 11.
FIG. 12B is a diagram showing a top view of an arrangement of thermoelements on the metal links of FIG. 12A.
FIG. 12C is a diagram showing a top view of a second stage of thermoelements on top of the thermoelements of FIG. 12B.
FIG. 12D is a diagram showing a top view of a top arrangement of metal links covering the thermoelements of FIG. 12C.

FIGS. 12A-12D shows diagrams of the addition of layers to form the thermoelectric converter 1100 during fabrication. FIG. 12A shows the metal links 140b laid out over the substrate layer 110b for the hot side 117 of the thermoelectric converter 1100. FIG. 12B shows the addition of the first stage thermoelements 1120, 1130 disposed on the upper surface of the metal links 140b disposed on the substrate layer 110b for the hot side 117. FIG. 12C shows the disposition of the second stage thermoelements 1120, 1130 on top of the first stage thermoelements 1120, 1130. The second stage thermoelements 1120, 1130 may have greater electrical resistances than the first stage thermoelements 1120, 1130. The electrical resistances of the thermoelements 1120, 1130 may be adjusted by modifying the cross-sectional areas and/or thicknesses of the thermoelements 1120, 1130 so that they are different between stages. FIG. 12D shows the application of the metal links 140a on top of the second stage thermoelements 1120, 1130 such that the substrate layer 110a for the cold side 113 may be applied on top of the metal links 140a. In some embodiments, each of the layers and stages may be attached by forming a connection using soldering or brazing.

Figure 13:
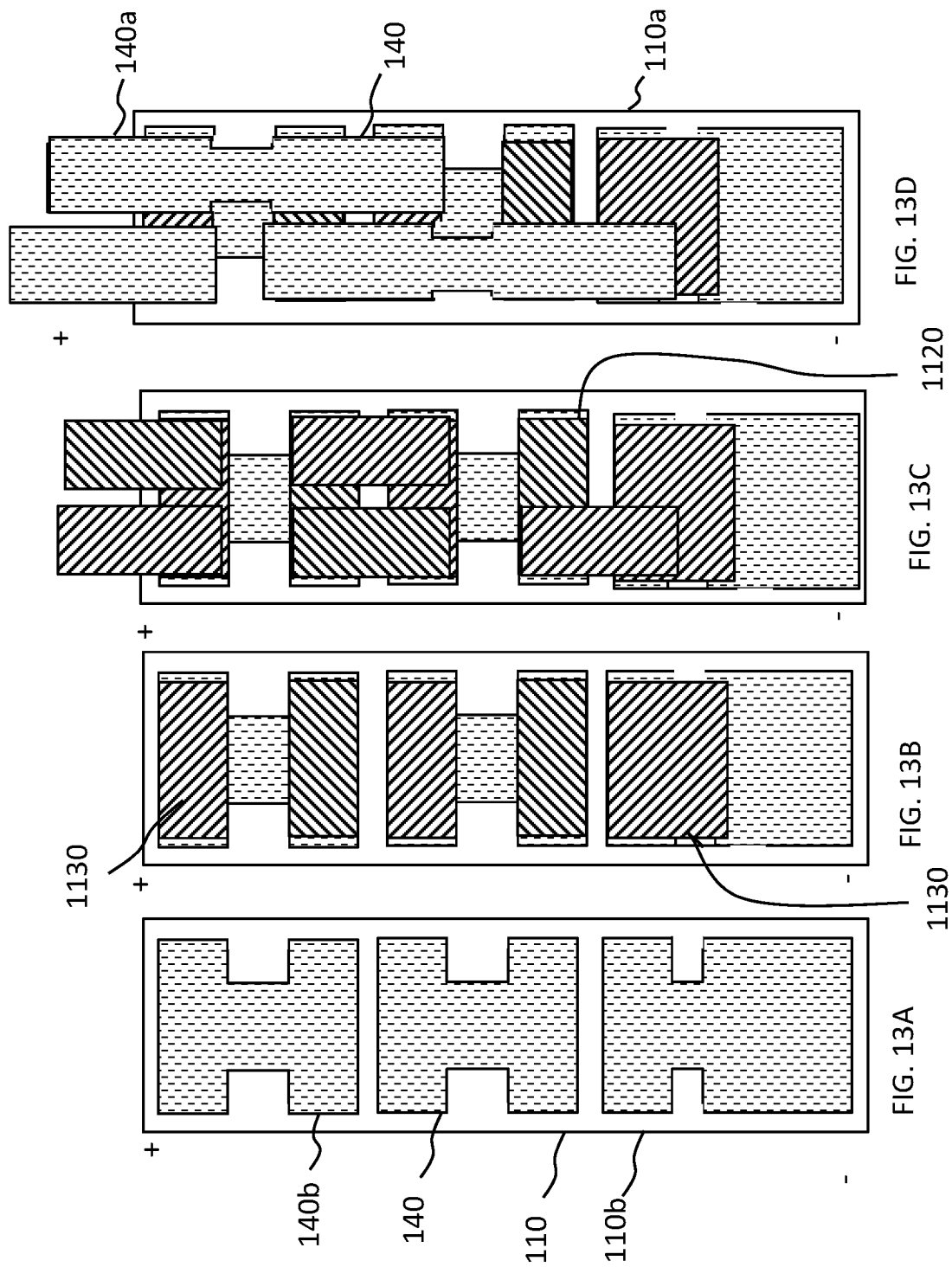
FIG. 13A is a diagram showing atop view of an arrangement of metal links for the end portion of the π-morph two-stage thermoelectric converter of FIG. 11.
FIG. 13B is a diagram showing a top view of an arrangement of thermoelements on the metal links of FIG. 13A.
FIG. 13C is a diagram showing a top view of a second stage of thermoelements on top of the thermoelements of FIG. 13B.
FIG. 13D is a diagram showing a top view of a top arrangement of metal links covering the thermoelements of FIG. 13C.

FIGS. 13A-13D shows diagrams of the addition of layers to form the thermoelectric converter 1100 during fabrication. While FIGS. 12A-12D shows the layers for forming middle unit cells, FIGS. 13A-13D show layers for forming front and end unit cells. Middle unit cells 530, 950 and their alternating and/or bordering metal links 140 extend between the upper substrate layer 110a and the lower substrate layer 110b. Front and end unit cells 510, 520, 910, 940, even when they have multiple stages, extend upward from the lower substrate layer 110b but leave a space above the uppermost stage and the upper substrate layer 110a. FIG. 13A shows the metal links 140b for the bottom (hot side) laid out. FIG. 13B shows the addition of the first stage thermoelements 1120, 1130 disposed on the upper surface of the metal links 140b disposed on the substrate layer 110b for the hot side 117. FIG. 13C shows the disposition of the second stage thermoelements 1120, 1130 on top of the first stage thermoelements 1120, 1130. FIG. 13D shows the application of the metal links 140a on top of the second stage thermoelements 1120, 1130 such that the substrate layer 110a for the cold side 113 may be applied on top of the metal links 140a. In some embodiments, each of the layers and stages may be attached by forming a connection using soldering or brazing.

Figure 14:
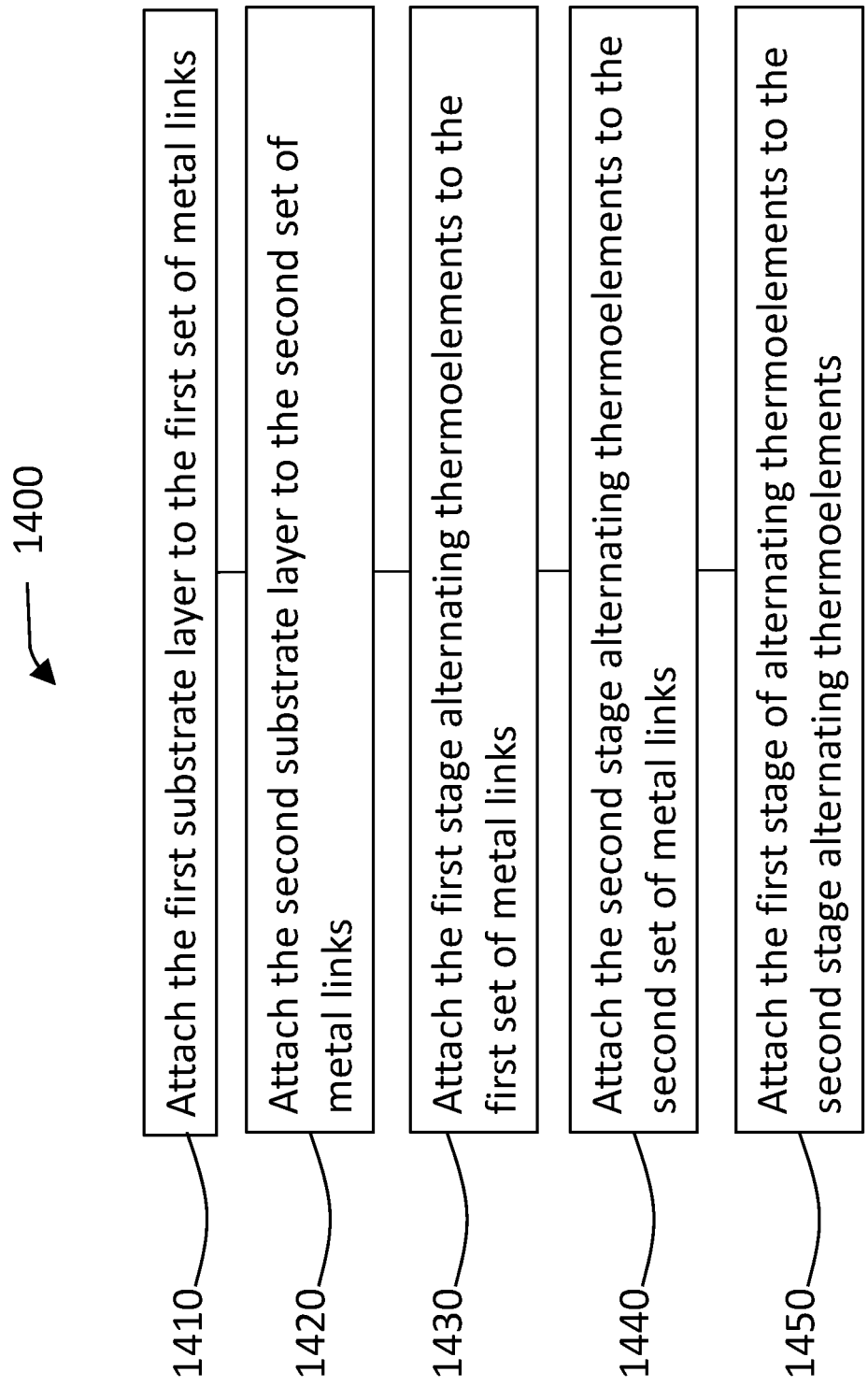
FIG. 14 is a flow chart of a method for fabricating a thermoelectric converter as shown in FIGS. 12A-12D and 13A-13D.

FIG. 14 shows a flow chart for fabricating the thermoelectric apparatus 600, 900, 1100. Fabrication may be performed using a method 1400, where, in step 1410 the first substrate layer 110b is attached to the first set of metal links 140b. In step 1420, the second set substrate layer 110a is attached to the second set of metal links 140a. In some embodiments, steps 1410 and 1420 may be optional since prefabricated metal link-substrate layer units may be used. In step 1430, the first stage alternating thermoelements 1120, 1130 of FIG. 12B may be attached to the metal links 140b. In step 1440, the second stage thermoelements 1120, 1130 of FIG. 12C may be attached to the second set of metal links 140a. In step 1450, second stage thermoelements 1120, 1130 is attached to the first stage thermoelements 1120, 1130. Each of the attaching steps may use soldering or brazing to form connections between the layers and stages.

Figure 15:
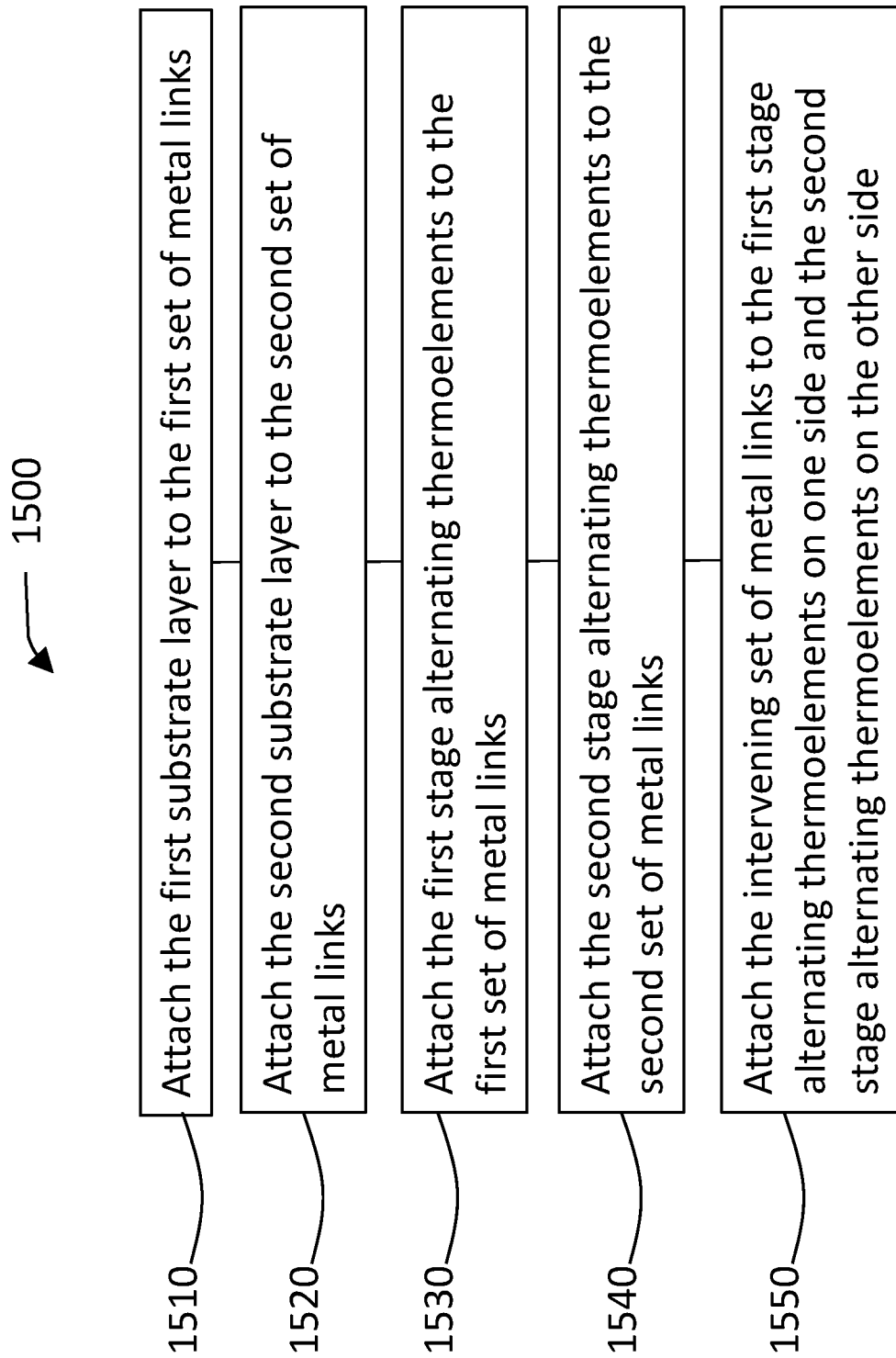
FIG. 15 is a flow chart of another method for fabricating at thermoelectric converter as shown in according to one embodiment of the present disclosure.

FIG. 15 shows a flow chart for fabricating the thermoelectric apparatus 100, 300, Fabrication may be performed using a method 1500, where, in step 1510 the first substrate layer 110b is attached to the first set of metal links 140b. In step 1520, the second set substrate layer 110a is attached to the second set of metal links 140a. In some embodiments, steps 1510 and 1520 may be optional since prefabricated metal link-substrate layer units may be used. In step 1530, the first stage alternating thermoelements 120, 130 may be attached to the metal links 140b. In step 1540, the second stage thermoelements 120, 130 may be attached to the second set of metal links 140a. In step 1550, the intervening set of metal links 140c is attached to the first stage thermoelements on one side (the bottom side) and is concurrently attached to the second stage thermoelements 120, 130 on the other side (the top side). Each of the attaching steps may use soldering or brazing to form connections between the layers and stages.

While the disclosure has been described with reference to exemplary embodiments, it will be understood that various changes may be made and equivalents may be substituted for elements thereof without departing from the scope of the disclosure. In addition, many modifications will be appreciated to adapt a particular instrument, situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A thermoelectric apparatus, the apparatus comprising:
a first substrate layer;
a first set of metal links disposed on one side of the first substrate layer;
a first stage of thermoelements disposed on and in electrical and thermal communication with the first set of metal links and comprising:
a first plurality of n-type thermoelements; and
a first plurality of p-type thermoelements alternating with the first plurality of n-type thermoelements;
a second stage of thermoelements disposed on and in direct electrical and thermal communication with the first stage of thermoelements and comprising:
a second plurality of n-type thermoelements; and
a second plurality of p-type thermoelements alternating with the second plurality of n-type thermoelements;
a second set of metal links disposed on and in electrical and thermal communication with the second stage of thermoelements; and
a second substrate layer disposed on the second set of metal links.

2. The apparatus of claim 1, wherein the apparatus has a front end and a back end and wherein the first stage thermoelement closest to the front end is the same type as the second stage thermoelement closest to the front end.

3. The apparatus of claim 2, wherein the first stage thermoelement closest to the back end is the same type as the second stage thermoelement closest to the back end.

4. The apparatus of claim 1, wherein the thermoelements of the second stage have greater electrical resistances than the thermoelements of the first stage.

5. The apparatus of claim 1, wherein the n-type thermoelements comprise an n-type thermoelectric material comprising at least one of: alloys of Bismuth Telluride and Bismuth Selenide, $Bi_2Te_{2.7}Se_{0.3}$, P-doped SiGe, $YbAl_3$, P-doped Si, SiGe nanowires, rare earth tellurides, $La_3Te_4$, $Pr_3Te_4$, skutterudites, Ba—Yb—$CoSb_3$, chacogenides, Pb—Sb—Ag—Te, Pb—Te—Se, Mg—Ag—Sb, half-Heusler alloys, and Hf—Zr—Ni—Sn—Sb.

6. The apparatus of claim 1, wherein the p-type thermoelements comprise a p-type thermoelectric material comprising at least one of: alloys of bismuth telluride and antimony telluride, $Bi_{0.5}Sb_{1.5}Te_3$, B-doped SiGe, B-doped Si, SiGe nanowires, $Zn_4Sb_3$, skutterudites, $CeFe_{3.5}Co_{0.5}Sb_{12}$, Zintl compounds, $Yb_{14}MnSb_{11}$, rare earth tellurides, Ce$_3$Te$_4$, MnSi$_{1.73}$, SnSe, PbSbAgSnTe, CePd$_3$, NaCo$_2$O$_4$, half-Heusler alloys, and Nb—Ti—Fe—Sb—Sn.

7. The apparatus of claim 1, wherein the n-type thermoelements comprise Bi$_{2-x}$Sb$_x$Te$_3$ and the p-type thermoelements comprise Bi$_2$Te$_{3-y}$Se$_y$, where x is between about 1.4 and 1.6 and y is between about 0.1 and 0.3.

8. The apparatus of claim 1, wherein the substrate layer comprises one of: a ceramic, an insulator and metal combination, and an insulator and semiconductor combination.

9. The apparatus of claim 8, wherein the ceramic comprises at least one of: alumina Al$_2$O$_3$, aluminum nitride (AlN), berylium oxide (BeO), boron nitride (BN), diamond (C), silicon nitride (SiN), and sapphire (SiC).

10. The apparatus of claim 8, where, in the insulator and metal combination, the insulator comprises at least one of: polymide, parylene, anodized aluminum, anodized molybdenum, CVD alumina, plated ceramics, and parylene or polymide-coated anodized alumina; and the metal comprises at least one of: aluminum, copper, nickel, molybdenum, molybdenum-copper alloy, tungsten-copper alloy, and copper-aluminum composite.

11. The apparatus of claim 8, where, in the insulator and semiconductor combination, the insulator comprises at least one of: thermal silicon oxide, CVD silicon oxide, and silicon nitride (SiN); and the semiconductor comprises one of: silicon and silicon carbide (SiC).

12. The apparatus of claim 8, wherein the insulator is equal to or less than about 10 micrometers thick.

13. The apparatus of claim 1, wherein the metal links comprise at least one of: 1) copper, 2) copper with a coating of nickel, gold, platinum/gold alloy, or silver, 3) nickel with a coating of gold, platinum/gold alloy, or silver.

14. The apparatus of claim 1, wherein each of the n-type and p-type thermoelements comprises:
a pair of metal layers;
a pair of coating layers disposed between the metal layers; and
one of an n-type and p-type thermoelectric material disposed between the pair of coating layers.

15. The apparatus of claim 14, wherein the coating layers comprise at least one of: titanium tungsten (TiW), tantalum nitride (TaN), tantalum (Ta), and nickel (Ni).

16. A thermoelectric apparatus, the apparatus comprising:
a first substrate layer;
a first set of metal links disposed on one side of the first substrate layer;
a first stage of thermoelements disposed on and in electrical and thermal communication with the first set of metal links and comprising:
a first plurality of n-type thermoelements; and
a first plurality of p-type thermoelements alternating with the first plurality of n-type thermoelements;
a second stage of thermoelements disposed on and in direct electrical and thermal communication with the first stage of thermoelements and comprising:
a second plurality of n-type thermoelements; and
a second plurality of p-type thermoelements alternating with the second plurality of n-type thermoelements;
a third stage of thermoelements disposed on and in direct electrical and thermal communication with the second stage of thermoelements and comprising:
a third plurality of n-type thermoelements; and
a third plurality of p-type thermoelements alternating with the third plurality of n-type thermoelements;
a second set of metal links disposed on and in electrical and thermal communication with the third stage of thermoelements; and
a second substrate layer disposed on the second set of metal links.

17. The apparatus of claim 16, wherein the apparatus has a front end and a back end and wherein the first stage thermoelement closest to the front end is the same type as the second stage thermoelement closest to the front end and is the same type as the third stage thermoelement closest to the front end.

18. The apparatus of claim 17, wherein the first stage thermoelement closest to the back end is the same type as the second stage thermoelement closest to the back end and is the same type as the third stage thermoelement closest to the back end.

19. The apparatus of claim 16, wherein the thermoelements of the second stage have greater electrical resistances than the thermoelements of the first stage.

* * * * *